(12) United States Patent
Jang et al.

(10) Patent No.: US 12,159,966 B2
(45) Date of Patent: Dec. 3, 2024

(54) LIGHT EMITTING DEVICE FOR DISPLAY AND LED DISPLAY APPARATUS HAVING THE SAME

(71) Applicant: SEOUL VIOSYS CO., LTD., Gyeonggi-do (KR)

(72) Inventors: Jong Min Jang, Ansan-si (KR); Chang Yeon Kim, Ansan-si (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/200,400

(22) Filed: May 22, 2023

(65) Prior Publication Data

US 2023/0378412 A1 Nov. 23, 2023

Related U.S. Application Data

(63) Continuation of application No. 17/076,750, filed on Oct. 21, 2020, now Pat. No. 11,658,275.
(Continued)

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 25/0756* (2013.01);
(Continued)

(58) Field of Classification Search
CPC . H01L 33/62; H01L 25/0753; H01L 25/0756; H01L 33/0008; H01L 33/24;
(Continued)

(56) References Cited

U.S. PATENT DOCUMENTS

| 8,981,391 B2 | 3/2015 | Lin et al. |
| 9,202,994 B2 | 12/2015 | Hashimoto et al. |

(Continued)

FOREIGN PATENT DOCUMENTS

| CN | 106847800 A | 6/2017 |
| JP | 11-503879 A | 3/1999 |

(Continued)

OTHER PUBLICATIONS

European Search Report for European Application No. EP20881323. 8, dated Sep. 7, 2023, 10 pages.
(Continued)

*Primary Examiner* — Victor A Mandala
(74) *Attorney, Agent, or Firm* — LaBatt, LLC

(57) ABSTRACT

A light emitting device including a first light emitter, a second light emitter, and a third light emitter, each including a first conductivity type semiconductor layer and a second conductivity type semiconductor layer. An adhesive layer includes a first adhesive portion disposed between the first light emitter, and the second light emitter, and a second adhesive portion disposed between the second light emitter and the third light emitter, in which the second light emitter is disposed between the first light emitter and the third light emitter, and the first adhesive portion and the second adhesive portion are optically transmitting and connect adjacent light emitters.

18 Claims, 38 Drawing Sheets

Related U.S. Application Data

(60) Provisional application No. 62/926,590, filed on Oct. 28, 2019.

(51) Int. Cl.
  *H01L 33/00* (2010.01)
  *H01L 33/24* (2010.01)
  *H01L 33/56* (2010.01)

(52) U.S. Cl.
  CPC .......... *H01L 33/0008* (2013.01); *H01L 33/24* (2013.01); *H01L 33/56* (2013.01)

(58) Field of Classification Search
  CPC ..... H01L 33/56; H01L 33/0016; H01L 33/08; H01L 33/14; H01L 33/382; H01L 33/20; H01L 33/42; H01L 27/153; H01L 33/44; H01L 27/156; H01L 24/31; H01L 33/385; H01L 33/52
  See application file for complete search history.

(56) References Cited

U.S. PATENT DOCUMENTS

| | | | |
|---|---|---|---|
| 10,170,666 B2 | 1/2019 | Cha et al. | |
| 11,527,514 B2* | 12/2022 | Chae | H01L 33/08 |
| 11,527,519 B2* | 12/2022 | Chae | H01L 33/62 |
| 11,955,505 B2* | 4/2024 | Li | H01L 33/60 |
| 2003/0047742 A1 | 3/2003 | Hen | |
| 2012/0146045 A1 | 6/2012 | Sugiyama et al. | |
| 2014/0284633 A1 | 9/2014 | Tsay et al. | |
| 2019/0097088 A1 | 3/2019 | Huppmann et al. | |
| 2019/0165038 A1* | 5/2019 | Chae | H01L 27/156 |
| 2019/0165207 A1* | 5/2019 | Kim | H01L 33/385 |
| 2019/0189596 A1* | 6/2019 | Chae | H01L 33/50 |
| 2019/0189681 A1* | 6/2019 | Chae | H01L 25/0756 |
| 2019/0198565 A1* | 6/2019 | Lee | H01L 33/30 |
| 2019/0206927 A1* | 7/2019 | Lee | H01L 25/0753 |
| 2019/0259735 A1 | 8/2019 | Li et al. | |
| 2020/0058825 A1* | 2/2020 | Jang | H01L 33/06 |
| 2020/0144233 A1* | 5/2020 | Lee | H01L 33/08 |
| 2020/0212262 A1* | 7/2020 | Jang | H01L 25/0756 |
| 2020/0303607 A1* | 9/2020 | Jang | H01L 33/387 |
| 2020/0365568 A1* | 11/2020 | Jang | H01L 33/0093 |
| 2020/0403026 A1* | 12/2020 | Li | H01L 25/0753 |
| 2021/0125972 A1* | 4/2021 | Jang | H01L 27/153 |
| 2021/0126046 A1* | 4/2021 | Jang | H01L 27/156 |
| 2022/0392879 A1* | 12/2022 | Chae | H01L 33/405 |
| 2022/0392950 A1* | 12/2022 | Chae | H01L 25/13 |
| 2022/0393063 A1* | 12/2022 | Kim | H01L 33/42 |
| 2024/0088197 A1* | 3/2024 | Jang | H01L 27/15 |
| 2024/0097094 A1* | 3/2024 | Yang | H01L 33/387 |

FOREIGN PATENT DOCUMENTS

| | | |
|---|---|---|
| JP | 2003282957 A | 10/2003 |
| JP | 2007080885 A | 3/2007 |
| JP | 2014-175427 | 9/2014 |
| JP | 2014-187366 | 10/2014 |
| KR | 1020060008029 A | 1/2006 |
| KR | 10-2017-0115142 | 10/2017 |
| KR | 10-2018-0102424 | 9/2018 |
| WO | 9723912 A2 | 7/1997 |

OTHER PUBLICATIONS

International Search Report dated Feb. 24, 2021, issued to PCT/KR2020/014768 (With English Translation).

Office Action for U.S. Appl. No. 17/076,750, mailed on Dec. 20, 2022, 11 pages.

Notice of Allowance for U.S. Appl. No. 17/076,750, mailed on Apr. 5, 2023, 10 pages.

Office Action for Japanese Patent Application No. 2022-525583 (no English translation available), Sep. 17, 2024, 4 pages.

* cited by examiner

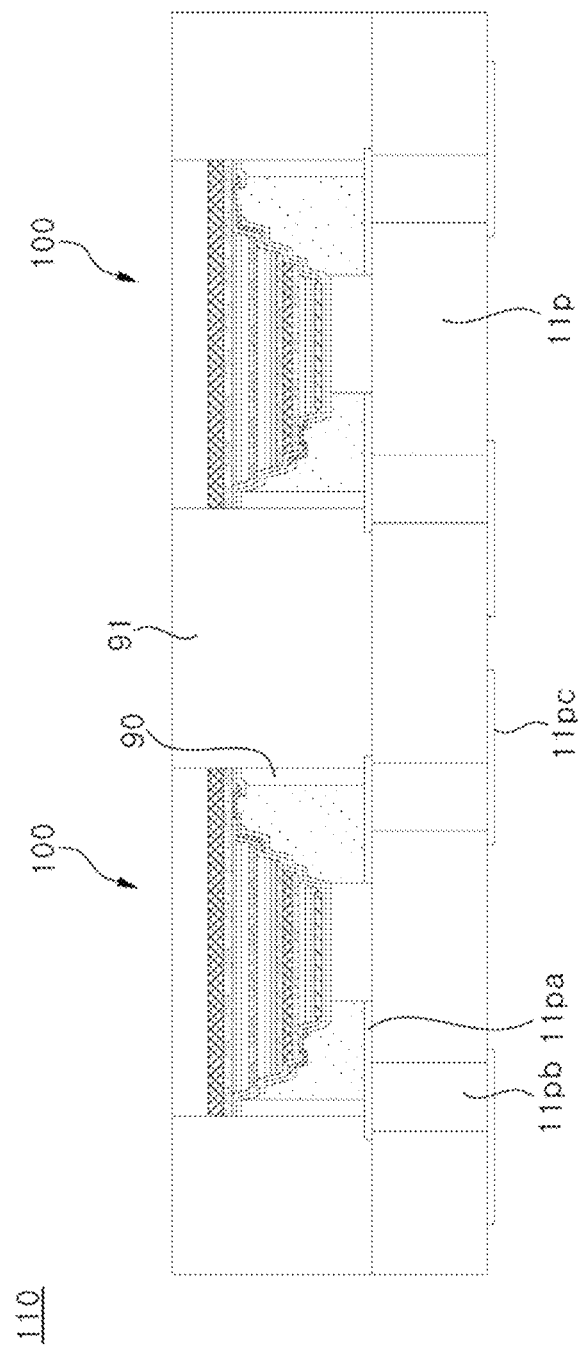

LIGHT EMITTING DEVICE FOR DISPLAY AND LED DISPLAY APPARATUS HAVING THE SAME

CROSS-REFERENCE TO RELATED APPLICATION

This application is a continuation of U.S. patent application Ser. No. 17/076,750, filed on Oct. 21, 2020, which claims the benefit of U.S. Provisional Patent Application No. 62/926,590, filed on Oct. 28, 2019, each of which is hereby incorporated by reference for all purposes as if fully set forth herein.

BACKGROUND

Field

Exemplary embodiments of the invention relate generally to a light emitting device for display and an LED display apparatus having the same.

Discussion of the Background

As an inorganic light source, light emitting diodes have been used in various technical fields, such as displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been used as backlight light sources in display apparatuses. However, LED displays that directly display images using the light emitting diodes have been recently developed.

In general, a display apparatus realizes various colors through mixture of blue, green, and red light. In order to display various images, the display apparatus includes a plurality of pixels, each including sub-pixels that correspond blue, green, and red light, respectively. In this manner, a color of a certain pixel is determined based on the colors of the sub-pixels so that images can be displayed through combination of such pixels.

Since LEDs can emit various colors depending upon materials thereof, a display apparatus may be provided by arranging individual LED chips emitting blue, green, and red light on a two-dimensional plane. However, when one LED chip is arranged in each sub-pixel, the number of LED chips may be increased, which may require excessive time for a mounting process during manufacture.

In addition, since the sub-pixels are arranged on the two-dimensional plane in the display apparatus, a relatively large area is occupied by one pixel that includes the sub-pixels for blue, green, and red light. Accordingly, an area of each LED chip needs to be reduced to arrange the sub-pixels in a restricted area. However, reduction in size of LED chips may cause difficulty in mounting LED chips, as well as reducing luminous areas of the LED chips.

The above information disclosed in this Background section is only for understanding of the background of the inventive concepts, and, therefore, it may contain information that does not constitute prior art.

SUMMARY

Display apparatus constructed according to exemplary embodiments of the invention are capable of increasing an area of each sub-pixel in a restricted pixel area.

Exemplary embodiments also provide a display apparatus that is capable of reducing a time associated with a mounting process.

Additional features of the inventive concepts will be set forth in the description which follows, and in part will be apparent from the description, or may be learned by practice of the inventive concepts.

A light emitting device according to an exemplary embodiment includes a first light emitting stack, a second light emitting stack, and a third light emitting stack each including a first conductivity type semiconductor layer and a second conductivity type semiconductor layer, a first adhesive layer bonding the first light emitting stack and the second light emitting stack, and a second adhesive layer bonding the second light emitting stack and the third light emitting stack, in which the second light emitting stack is disposed between the first light emitting stack and the third light emitting stack, and one of the first adhesive layer and the second adhesive layer electrically connects adjacent light emitting stacks.

The one of the first and second conductive adhesive layers that electrically connects adjacent light emitting stacks may include indium tin oxide (ITO).

The first, second, and third light emitting stacks may be configured to emit red light, blue light, and green light, respectively.

The light emitting device may further include a first connection electrode electrically connected to the first light emitting stack, a second connection electrode electrically connected to the second light emitting stack, a third connection electrode electrically connected to the third light emitting stack, and a fourth connection electrode commonly electrically connected to the first, second, and third light emitting stacks.

The fourth connection electrode may be electrically connected to the adjacent light emitting stacks through the one of the first adhesive layer and the second adhesive layer electrically connecting the adjacent light emitting stacks.

The fourth connection electrode may be commonly electrically connected to the first conductivity type semiconductor layers of the first, second, and third light emitting stacks, and the first conductivity type semiconductor layers may include n-type semiconductor layers.

The fourth connection electrode may be commonly electrically connected to the second conductivity type semiconductor layers of the first, second, and third light emitting stacks, and the second conductivity type semiconductor layers may include p-type semiconductor layers.

The light emitting device may further include a protection layer surrounding at least portions of the first, second, third, and fourth connection electrodes.

The protection layer may include an epoxy molding compound or a polyimide film, and an upper surface of the protection layer may be substantially flush with upper surfaces of the first, second, third, and fourth connection electrodes.

The light emitting device may further include a substrate disposed adjacent to the third light emitting stack.

A light emitting device according to another exemplary embodiment includes a first light emitting stack, a second light emitting stack, and a third light emitting stack each including a first conductivity type semiconductor layer and a second conductivity type semiconductor layer, a first adhesive layer bonding the first light emitting stack and the second light emitting stack, a second adhesive layer bonding the second light emitting stack and the third light emitting stack, a first insulation layer covering the first, second, and third light emitting stacks, first, second, third, and fourth pads disposed on the first insulation layer, in which the first conductivity type semiconductor layers of the second and third light emitting stacks are interposed between the second conductivity type semiconductor layers of the second and third light emitting stacks, the first insulation layer includes a contact hole exposing both of the first conductivity type semiconductor layer of the second light emitting stack and the first conductivity type semiconductor layer of the third light emitting stack, and the fourth pad is electrically connected to the first conductivity type semiconductor layers of the second and third light emitting stacks through the contact hole.

The first pad may be electrically connected to the second conductivity type semiconductor layer of the first light emitting stack through the first insulation layer, the second pad may be electrically connected to the second conductivity type semiconductor layer of the second light emitting stack through the first insulation layer, the third pad may be electrically connected to the second conductivity type semiconductor layer of the third light emitting stack through the first insulation layer, and the fourth pad may be electrically connected to the first conductivity type semiconductor layer of the first light emitting stack through the first insulation layer.

The light emitting device may further include a second insulation layer covering the first, second, third, and fourth pads and having through holes exposing the first, second, third, and fourth pads, and first, second, third, and fourth connection electrodes disposed on the second insulation layer and electrically connected to the first, second, third, and fourth pads through the through holes of the second insulation layer, respectively.

The light emitting device may further include a protection layer surrounding at least portions of the first, second, third, and fourth connection electrodes.

A display apparatus may include a display substrate, a plurality of light emitting devices disposed on the display substrate, at least one of the light emitting device includes the light emitting device according to an exemplary embodiment, and a molding layer covering side surfaces of the light emitting devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 9A and 9B are a cross-sectional view and a plan view schematically illustrating a light emitting package according to an exemplary embodiment.

DETAILED DESCRIPTION

Figure 1A:
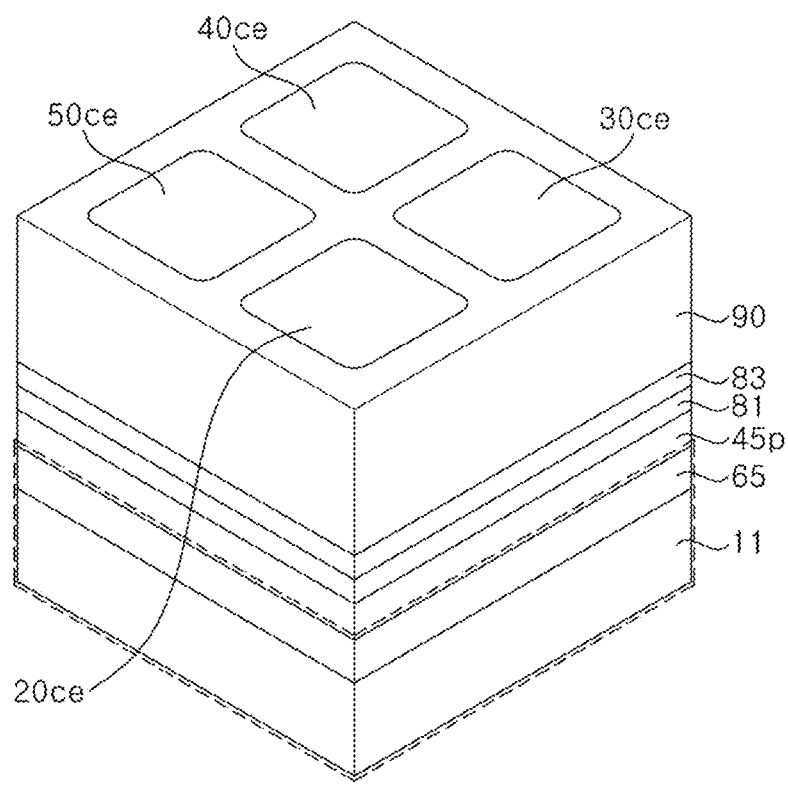
FIG. 1A is a schematic perspective view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings. Hereinafter, a light emitting stack structure, a light emitting device, or a light emitting package may include micro-LEDs, may have a light emitting area of 10,000 $\mu m^2$ or less as known in the art. In other exemplary embodiments, the micro-LED may have a light emitting area of 4,000 $\mu m^2$ or less, and further, 2,500 $\mu m^2$ or less.

Figure 1B:
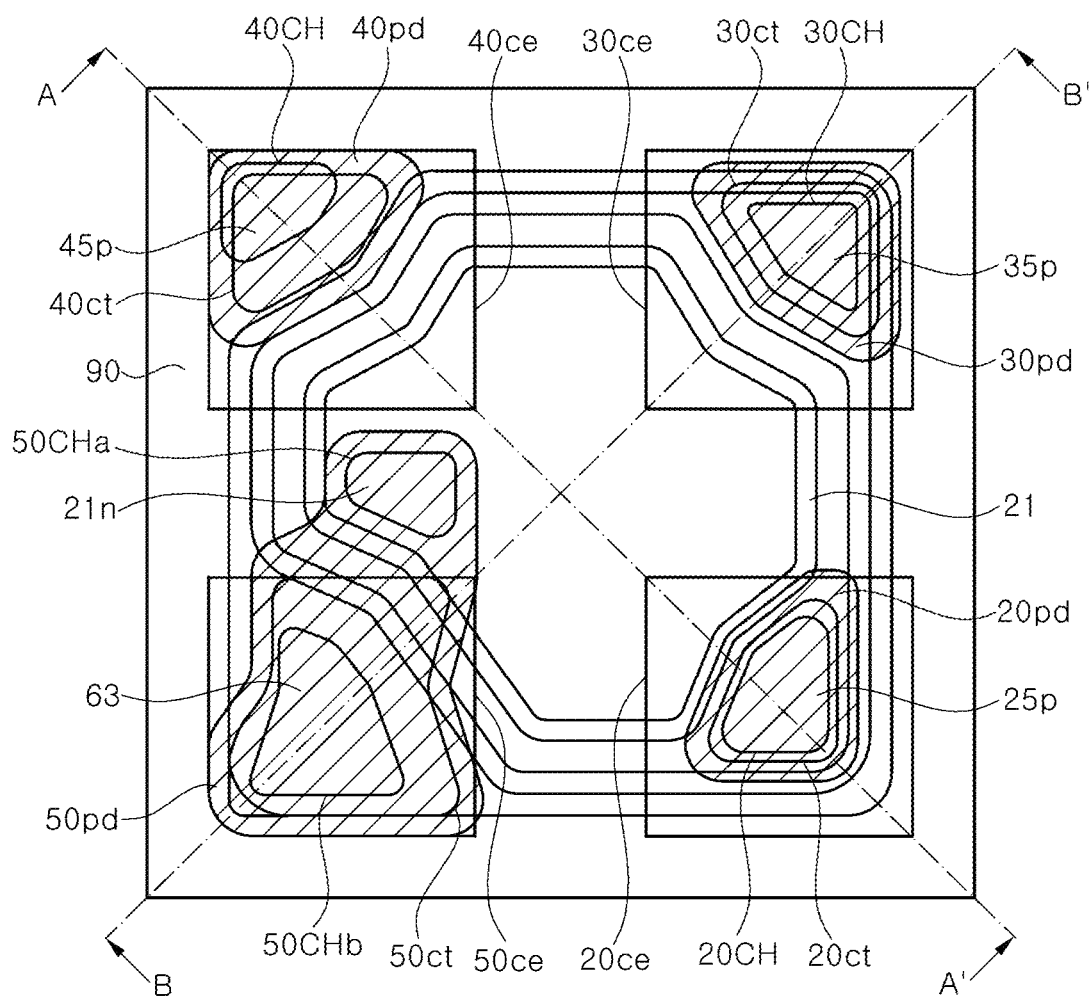
FIG. 1B is a schematic plan view of the light emitting device of FIG. 1A.
Figure 1C:
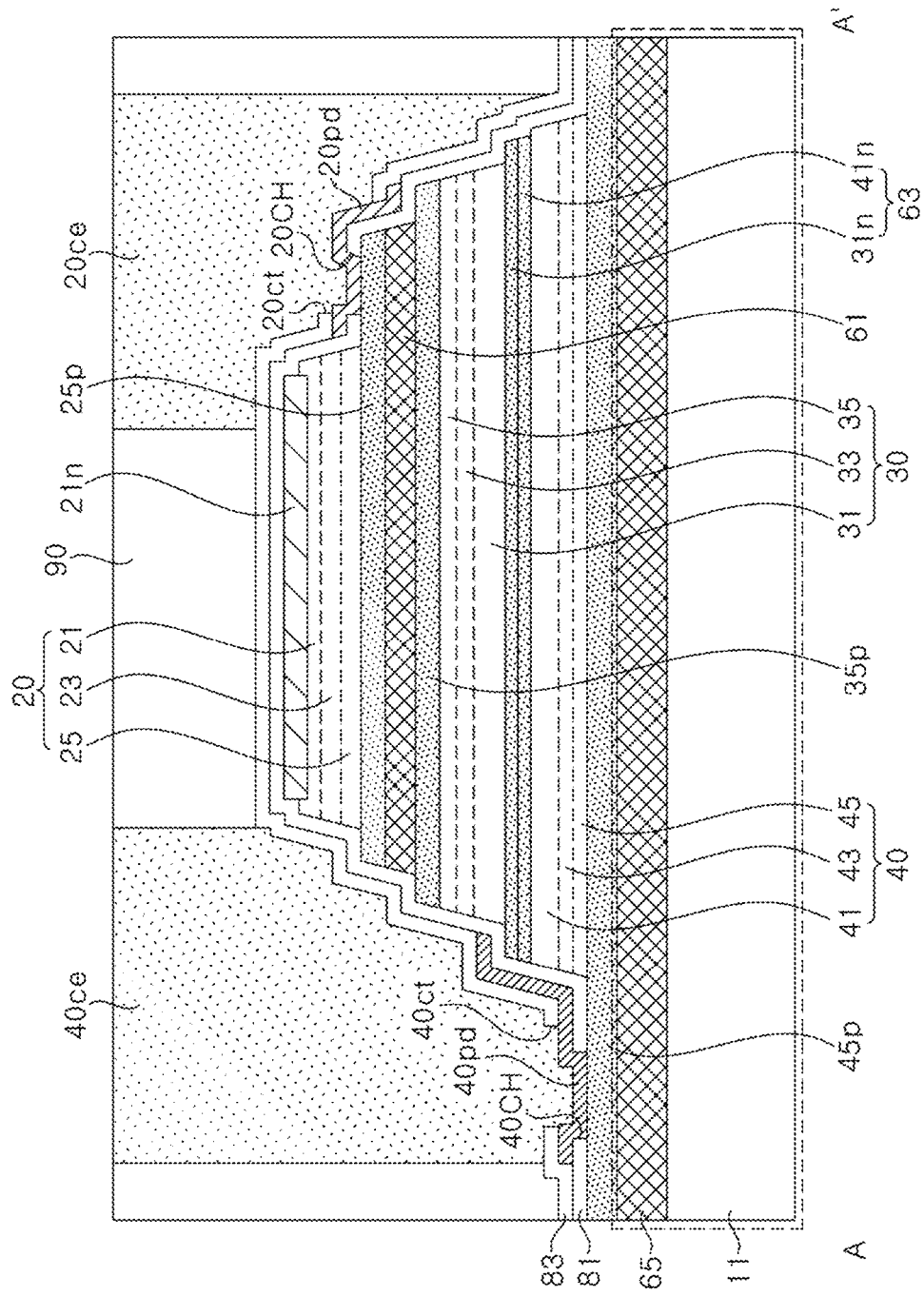
FIG. 1C and FIG. 1D are schematic cross-sectional views taken along lines A-A' and B-B' of FIG. 1B, respectively.
Figure 1D:
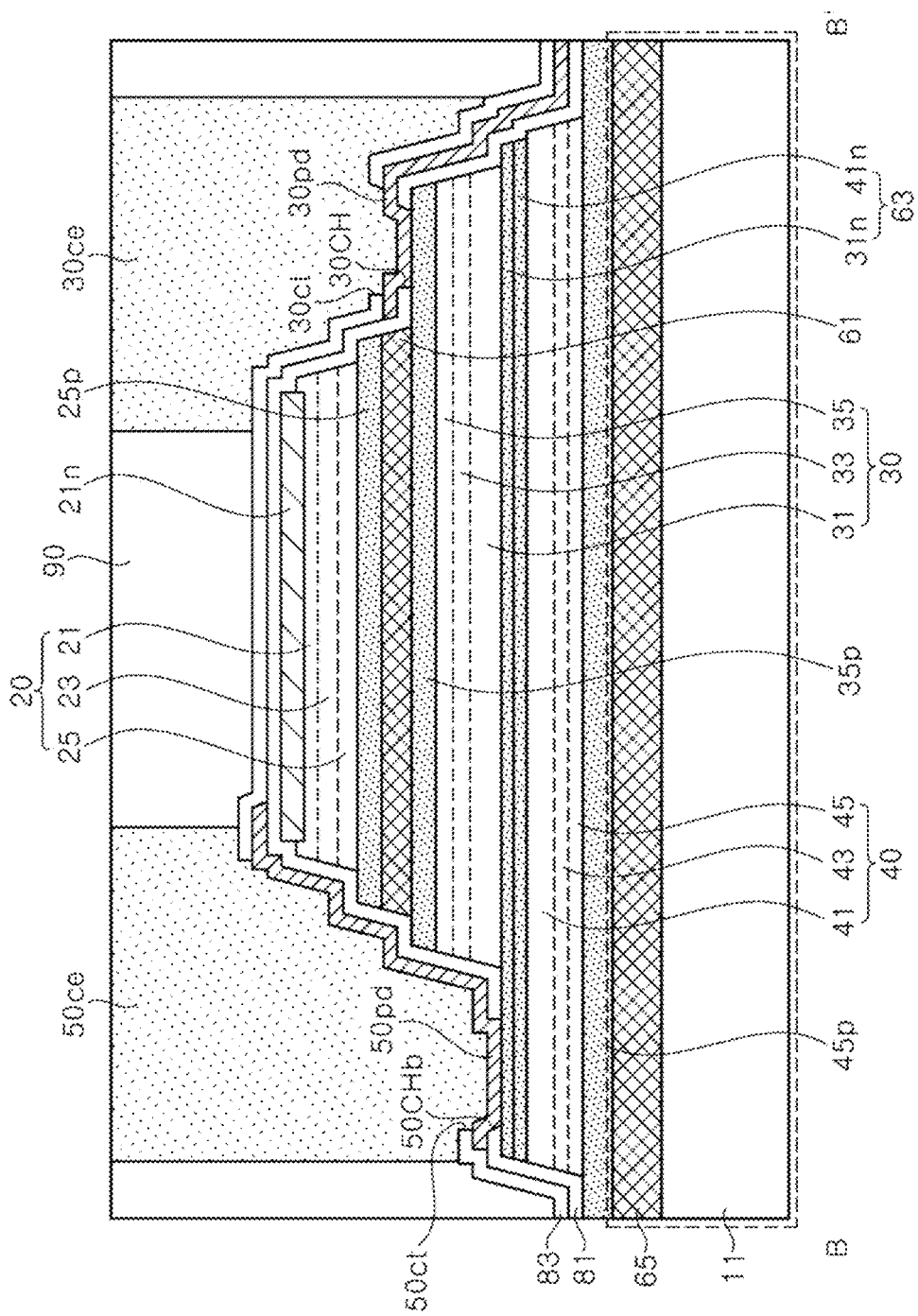

FIG. 1A is a schematic perspective view of a light emitting device according to an exemplary embodiment, FIG. 1B is a schematic plan view of the light emitting device of FIG. 1A, and FIG. 1C and FIG. 1D are schematic cross-sectional views taken along lines A-A' and B-B' of FIG. 1B, respectively.

Referring to FIGS. 1A and 1B, a light emitting device 100 includes a light emitting stack structure, a first connection electrode 20ce, a second connection electrode 30ce, a third connection electrode 40ce, and a fourth connection electrode 50ce formed on the light emitting stack structure, and a protection layer 90 surrounding the connection electrodes 20ce, 30ce, 40ce, and 50ce. An array of light emitting devices 100 may be formed on a single substrate, and the light emitting device 100 illustrated in FIG. 1A shows a singularized one from the array. Configuration and singularization of the light emitting devices 100 will be described later in more detail. In some exemplary embodiments, the light emitting device 100 including the light emitting stack structure may be further processed to be formed into a light emitting package, which will also be described later in more detail.

Referring to FIGS. 1A through 1D, the light emitting device 100 according to the illustrated exemplary embodiment may include a light emitting stack structure, which may include a first LED sub-unit, a second LED sub-unit, and a third LED sub-unit. The first LED sub-unit may include a first light emitting stack 20, the second LED sub-unit may include a second light emitting stack 30, and the third LED sub-unit may include a third light emitting stack 40. The light emitting stack structure is exemplarily shown as including three light emitting stacks 20, 30, and 40, but the inventive concepts are not limited to a specific number of light emitting stacks. For example, in some exemplary embodiments, the light emitting stack structure may include two or more light emitting stacks. Hereinafter, the light emitting stack structure will exemplarily be described as including three light emitting stacks 20, 30, and 40.

A substrate 11 supports the light emitting stacks 20, 30, and 40, and may be included in the light emitting device 100, or may be finally removed from the light emitting stacks 20, 30, and 40. When the substrate 11 is included in the light emitting device 100, the substrate 11 may include a light-transmitting insulating material that transmits light. For example, the substrate 11 may include sapphire, glass, quartz, silicon, an organic polymer, or an organic-inorganic composite material, and may be silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate, for example.

The first, second, and third light emitting stacks 20, 30, and 40 are configured to emit light toward the substrate 11 or towards a third lower contact electrode 45p. Accordingly, light emitted from the first light emitting stack 20 may pass through the second and third light emitting stacks 30 and 40. According to an exemplary embodiment, the first, second, and third light emitting stacks 20, 30, and 40 may emit light having different peak wavelengths from one another. In an exemplary embodiment, a light emitting stack disposed further from the third lower contact electrode 45p emits light having a longer wavelength than that emitted from a light emitting stack disposed closer to the third lower contact electrode 45p, and thus, light loss may be reduced. For example, the first light emitting stack 20 may emit red light, the second light emitting stack 30 may emit green light, and the third light emitting stack 40 may emit blue light.

In another exemplary embodiment, to adjust a color mixing ratio of the first, second, and third light emitting stacks 20, 30, and 40, the second light emitting stack 30 may emit light having a shorter wavelength than that of the third light emitting stack 40. Accordingly, luminance intensity of the second light emitting stack 30 may be reduced, and luminance intensity of the third light emitting stack 40 may be increased, and thus, luminance intensity ratios of light emitted from the first, second, and third light emitting stacks may be greatly changed. For example, the first light emitting stack 20 may be configured to emit red light, the second light emitting stack 30 may be configured to emit blue light, and the third light emitting stack 40 may be configured to emit green light. As such, luminance intensity of blue light may be relatively reduced, and luminance intensity of green light may be relatively increased, and thus, luminance intensity ratios of red, green, and blue light may be adjusted to approach 3:6:1. Moreover, light emitting areas of the first, second, and third light emitting stacks 20, 30, and 40 may be about 10,000 $\mu m^2$ or less, 4,000 $\mu m^2$ or less, or 2,500 $\mu m^2$ or less. In addition, as the light emitting stack is closer to the third lower contact electrode 45p, the emitting area thereof may become larger. As such, as the third light emitting stack 40 that emits green light is disposed closest to the third lower contact electrode 45p, luminance intensity of green light may be further increased.

The first light emitting stack 20 includes a first conductivity type semiconductor layer 21, an active layer 23, and a second conductivity type semiconductor layer 25. According to an exemplary embodiment, the first light emitting stack 20 may include a semiconductor material, such as AlGaAs, GaAsP, AlGaInP, and GaP that emits red light, but the inventive concepts are not limited thereto.

A first upper contact electrode 21n may be disposed on the first conductivity type semiconductor layer 21 and may be in ohmic contact with the first conductivity type semiconductor layer 21. A first lower contact electrode 25p may be disposed under the second conductivity type semiconductor layer 25. According to an exemplary embodiment, a portion of the first conductivity type semiconductor layer 21 may be patterned and recessed, and the first upper contact electrode 21n may be disposed in the recessed region of the first conductivity type semiconductor layer 21 to increase an ohmic contact level. The first upper contact electrode 21n may have a single-layer structure or a multiple-layer structure, and may include Al, Ti, Cr, Ni, Au, Ag, Sn, W, Cu, or an alloy thereof, such as Au—Te alloy or Au—Ge alloy, but the inventive concepts are not limited thereto. In an exemplary embodiment, the first upper contact electrode 21n may have a thickness of about 100 nm, and may include metal having high reflectivity to increase light emission efficiency in a downward direction toward the third lower contact electrode 45p.

The second light emitting stack 30 includes a first conductivity type semiconductor layer 31, an active layer 33, and a second conductivity type semiconductor layer 35. According to an exemplary embodiment, the second light emitting stack 30 may include a semiconductor material, such as GaN, InGaN, ZnSe that emits blue light, but the inventive concepts are not limited thereto. A second lower contact electrode 35p is disposed on the second conductivity type semiconductor layer 35 of the second light emitting stack 30.

The third light emitting stack 40 includes a first conductivity type semiconductor layer 41, an active layer 43, and a second conductivity type semiconductor layer 45. According to an exemplary embodiment, the third light emitting stack 40 may include a semiconductor material, such as GaN, InGaN, GaP, AlGaInP, AlGaP, or the like that emits green light. A third lower contact electrode 45p is disposed under the second conductivity type semiconductor layer 45 of the third light emitting stack 40. As described above, the semiconductor materials of the second light emitting stack 30 and the third light emitting stack 40 may be interchanged with each other.

According to an exemplary embodiment, each of the first conductivity type semiconductor layers 21, 31, and 41 and the second conductivity type semiconductor layers 25, 35, and 45 of the first, second, and third light emitting stacks 20, 30, and 40 may have a single-layer structure or a multiple-layer structure, and in some exemplary embodiments, may include a superlattice layer. In addition, the active layers 23, 33, and 43 of the first, second, and third light emitting stacks 20, 30, and 40 may have a single-quantum well structure or a multiple-quantum well structure.

Each of the first, second, and third lower contact electrodes 25p, 35p, and 45p may include a transparent conductive material that transmits light. For example, the lower contact electrodes 25p, 35p, and 45p may include transparent conductive oxide (TCO), such as SnO, InO$_2$, ZnO, indium tin oxide (ITO), indium tin zinc oxide (ITZO), or the like, without being limited thereto.

A first adhesive layer 61 is disposed between the first light emitting stack 20 and the second light emitting stack 30, a second adhesive layer 63 is disposed between the second light emitting stack 30 and the third light emitting stack 40, and a third adhesive layer 65 is disposed between the substrate 11 and the third light emitting stack 40.

The first adhesive layer 61 may include a non-conductive material that transmits light. For example, the first adhesive layer 61 may include an optically clear adhesive (OCA), which is epoxy, polyimide, SUB, spin-on-glass (SOG), benzocyclobutene (BCB), but the inventive concepts are not limited thereto.

In an exemplary embodiment, the second adhesive layer 63 includes a conductive material. The second adhesive layer 63 may be commonly electrically connected to the first conductivity type semiconductor layer 31 of the second light emitting stack 30 and the first conductivity type semiconductor layer 41 of the third light emitting stack 40. The second adhesive layer 63 may be, for example, a bonding layer of conductive oxide layers 31n and 41n, such as ITO. Forming the second adhesive layer 63 with a conductive material layer may facilitate an electrical connection between the first conductivity type semiconductor layer 31 and the first conductivity type semiconductor layer 41, thereby simplifying a manufacturing process of the light emitting device 100.

The third adhesive layer 65 bonds the substrate 11 and the third light emitting stack 40 to each other, and when the substrate 11 is removed, the third adhesive layer 65 may be removed together with the substrate 11. In this case, the third adhesive layer 65 may be formed of, for example, an adhesive material that reacts to a laser, and thus, the substrate 11 may be easily removed from the light emitting stacks 20, 30, and 40 using the laser.

According to the illustrated exemplary embodiment, a first insulation layer 81 and a second insulation layer 83 are disposed on at least portions of side surfaces of the first, second, and third light emitting stacks 20, 30, and 40. At least one of the first and second insulation layers 81 and 83 may include one or more of organic or inorganic insulating materials, such as polyimide, SiO$_2$, SiN$_x$, Al$_2$O$_3$, or the like. For example, at least one of the first and second insulation layers 81 and 83 may include a distributed Bragg reflector (DBR). As another example, at least one of the first and second insulation layers 81 and 83 may include a black organic polymer. In some exemplary embodiments, an electrically floating metal reflection layer may be disposed on the first and second insulation layers 81 and 83 to reflect light emitted from the light emitting stacks 20, 30, and 40 toward the third lower contact electrode 45p. In some exemplary embodiments, at least one of the first and second insulation layers 81 and 83 may have a single-layer structure or a multiple-layer structure formed of two or more insulation layers having different refractive indices.

The first conductivity type semiconductor layers 21, 31, and 41 of each of the light emitting stacks 20, 30, and 40 may be n-type, and the second conductivity type semiconductor layers 25, 35, and 45 of each of the light emitting stacks 20, 30, and 40 may be p-type. Each of the first, second, and third lower contact electrodes 25p, 35p, and 45p that are connected to the p-type semiconductor layers 25, 35, and 45 of the light emitting stacks, respectively, may be electrically connected to the first, second, and third connection electrodes 20ce, 30ce, and 40ce, respectively. The n-type semiconductor layers 21, 31, and 41 of the light emitting stacks 20, 30, and 40 may be commonly electrically connected to the fourth connection electrode 50ce. As such, the light emitting device 100 may have a common n-type light emitting stack structure, in which the n-type semiconductor layers 21, 31, and 41 of the first, second, and third light emitting stacks 20, 30, and 40 are commonly connected, and may be driven independently from one another. Since the light emitting device 100 has the common n-type light emitting structure, sources of voltages applied to the first, second, and third light emitting stacks 20, 30, and 40 may be set to be different from one another.

The light emitting device 100 according to the illustrated exemplary embodiment has the common n-type structure, but the inventive concepts are not limited thereto. For example, in some exemplary embodiments, the first conductivity type semiconductor layers 21, 31, and 41 of each of the light emitting stacks may be p-type, and the second conductivity type semiconductor layer 25, 35, and 45 of each of the light emitting stacks may be n-type, and thus, a common p-type light emitting stack structure may be formed. In addition, in some exemplary embodiments, the stacked sequence of each of the light emitting stacks is not limited to that shown in the drawing, but may be variously modified. Hereinafter, the light emitting device 100 will exemplarily be described with reference to the common n-type light emitting stack structure.

According to the illustrated exemplary embodiment, the light emitting device 100 includes a first pad 20pd, a second pad 30pd, a third pad 40pd, and a fourth pad 50pd. The first pad 20pd is electrically connected to the first lower contact electrode 25p through a first contact hole 20CH defined through the first insulation layer 81. The first connection electrode 20ce is electrically connected to the first pad 20pd through a first through hole 20ct defined through the second insulation layer 83. The second pad 30pd is electrically connected to the second lower contact electrode 35p through a second contact hole 30CH defined through the first insulation layer 81. The second connection electrode 30ce is electrically connected to the second pad 30pd through a second through hole 30ct defined through the second insulation layer 83.

The third pad 40pd is electrically connected to the third lower contact electrode 45p through a third contact hole 40CH defined through the first insulation layer 81. The third connection electrode 40ce is electrically connected to the third pad 40pd through a third through hole 40ct defined through the second insulation layer 83.

The fourth pad 50pd is electrically connected to the first conductivity type semiconductor layers 21, 31, and 41 of the first, second, and third light emitting stacks 20, 30, and 40 through a first sub-contact hole 50CHa and a second sub-contact hole 50CHb. The first sub-contact hole 50CHa may expose the first upper contact electrode 21n, and the fourth pad 50pd may be connected to the first upper contact electrode 21n through the first sub-contact hole 50CHa. In addition, the second sub-contact hole 50CHb may be formed on the second adhesive layer 63 to expose a portion of the second adhesive layer 63, and the fourth pad 50pd may be electrically connected to the second adhesive layer 63 through the second sub-contact hole 50CHb. By forming the second adhesive layer 63 with the conductive layer, the fourth pad 50pd may be commonly electrically connected to the first conductivity type semiconductor layer 31 and the first conductivity type semiconductor layer 41 using the second sub-contact hole 50CHb.

The fourth connection electrode 50ce is electrically connected to the fourth pad 50pd through a fourth through hole 50ct defined through the second insulation layer 83, and thus, the fourth connection electrode 50ce is commonly electrically connected to the first conductivity type semiconductor layers 21, 31, and 41 through the fourth through hole 50ct.

In the illustrated exemplary embodiment, although each of the connection electrodes 20ce, 30ce, 40ce, and 50ce are shown and described as directly contacting the pads 20pd, 30pd, 40pd, and 50pd, in some exemplary embodiments, the connection electrodes 20ce, 30ce, 40ce, and 50ce may not be directly connected to the pads 20pd, 30pd, 40pd, and 50pd, and another connector may be interposed there between.

The first, second, third, and fourth pads 20pd, 30pd, 40pd, and 50pd are spaced apart and insulated from one another. According to an exemplary embodiment, each of the first, second, third, and fourth pads 20pd, 30pd, 40pd, and 50pd may cover at least portions of side surfaces of the first, second, and third light emitting stacks 20, 30, and 40. In this manner, heat generated from the first, second, and third light emitting stacks 20, 30, and 40 may be easily dissipated.

According to the illustrated exemplary embodiment, each of the connection electrodes 20ce, 30ce, 40ce, and 50ce may have a substantially elongated shape that protrudes upward from the substrate 11. The connection electrodes 20ce, 30ce, 40ce, and 50ce may include metal, such as Cu, Ni, Ti, Sb, Zn, Mo, Co, Sn, Ag, or an alloy thereof, but the inventive concepts are not limited thereto. For example, each of the connection electrodes 20ce, 30ce, 40ce, and 50ce may include two or more metals or a plurality of different metal layers to reduce stress from the elongated shape of the connection electrodes 20ce, 30ce, 40ce, and 50ce. In another exemplary embodiment, when the connection electrodes 20ce, 30ce, 40ce, and 50ce include Cu, an additional metal may be deposited or plated to inhibit oxidation of Cu. In some exemplary embodiments, when the connection electrodes 20ce, 30ce, 40ce, and 50ce include Cu/Ni/Sn, Cu may prevent Sn from permeating into the light emitting stack structure. In some exemplary embodiments, the connection electrodes 20ce, 30ce, 40ce, and 50ce may include a seed layer for forming a metal layer in a plating process, which will be described later.

As shown in the drawings, each of the connection electrodes 20ce, 30ce, 40ce, and 50ce may have a substantially flat upper surface, thereby facilitating electrical connection between external lines or electrodes and the light emitting stack structure. According to an exemplary embodiment, when the light emitting device 100 includes micro LEDs having a surface area of about 10,000 µm$^2$ or less, about 4,000 µm$^2$ or less, or less or about 2,500 µm$^2$ or less, as known in the art, the connection electrodes 20ce, 30ce, 40ce, and 50ce may be overlapped with at least a portion of one of the first, second, and third light emitting stacks 20, 30, and 40 as shown in the drawing. More specifically, the connection electrodes 20ce, 30ce, 40ce, and 50ce may be overlapped with at least one step that is formed on the side surface of the light emitting stack structure. Since a lower surface of the connection electrode provides a greater contact area than that of an upper surface thereof, a larger contact area may be formed between the connection electrode 20ce, 30ce, 40ce, and 50ce and the light emitting stack structure. Accordingly, the connection electrodes 20ce, 30ce, 40ce, and 50ce may be more stably formed on the light emitting stack structure than those of a conventional light emitting device. In this manner, the structure of the light emitting device 100 may be strengthened with a larger contact area between the connection electrodes 20ce, 30ce, 40ce, and 50ce and the light emitting stack structure. In addition, since the connection electrodes 20ce, 30ce, 40ce, and 50ce may be overlapped with at least one step that is formed on the side surface of the light emitting stack structure, heat generated in the light emitting stack structure may be dissipated to the outside more efficiently.

In some exemplary embodiments, at least one of the connection electrodes 20ce, 30ce, 40ce, and 50ce may be overlapped with the side surface of each of the light emitting stacks 20, 30, and 40, and thus, the light emitting stacks 20, 30, and 40 may efficiently dissipate heat that is generated inside thereof. Furthermore, when the connection electrodes 20ce, 30ce, 40ce, and 50ce include a reflective material, such as metal, the connection electrodes 20ce, 30ce, 40ce, and 50ce may reflect light that is emitted from at least one or more of the light emitting stacks 20, 30, and 40, and thus, luminous efficiency may be improved.

In general, during the manufacturing process, an array of a plurality of light emitting devices may be formed on the substrate 11. The substrate 11 is cut along scribing lines to singularize (separate) each of the light emitting devices, and the light emitting device may be transferred to another substrate or a tape using various transfer techniques for further processing of the light emitting devices, such as packaging. In this case, when the light emitting device includes connection electrodes, such as metal bumps or pillars protruding outward from the light emitting structure, due to the structure of the light emitting device exposing the connection electrodes to the outside, during a subsequent process, for example, a transfer stage, various problems may occur. In addition, when the light emitting device includes micro-LEDs having a surface area of about 10,000 m$^2$ or less, about 4,000 µm$^2$ or less, or about 2,500 µm$^2$ or less, depending on the application, handling of the light emitting device may be more difficult due to its small form factor.

For example, when the connection electrode has a substantially elongated shape such as a rod, transferring the light emitting device using a conventional vacuum method may become difficult because the light emitting device may not have a sufficient suction area due to the protruding structure of the connection electrode. In addition, the exposed connection electrode may be directly affected by various stress during a subsequent process, such as when the connection electrode contacts a manufacturing apparatus, which may damage the structure of the light emitting device. As another example, when the light emitting device is transferred by attaching an adhesive tape on the upper surface of the light emitting device (for example, a surface opposite to the substrate), a contact area between the light emitting device and the adhesive tape may be limited to the upper surface of the connection electrode. In this case, contrary to a case when the adhesive tape is attached to the lower surface of the light emitting device (for example, the substrate), an adhesive force between the light emitting device and the adhesive tape may be weakened, and the light emitting device may be undesirably separated from the adhesive tape while transferring the light emitting device. As another example, when transferring the light emitting device using a conventional pick-and-place method, a discharge pin may directly contact a portion of the light emitting device disposed between connection electrodes, and thus, an upper structure of the light emitting structure may be damaged. In particular, the discharge pin may hit the center of the light emitting device, and cause physical damage to an upper light emitting stack of the light emitting device.

According to an exemplary embodiment, the protection layer 90 may be formed on the light emitting stack structure. More specifically, as shown in FIG. 1A, the protection layer 90 may be formed between the connection electrodes 20ce, 30ce, 40ce, and 50ce to cover at least the side surface of the light emitting stack structure. According to the illustrated exemplary embodiment, the protection layer 90 may expose side surfaces of the substrate 11, the first and second insulation layers 81 and 83, and the third light emitting stack 40. The protection layer 90 may be formed to be substantially flush with the upper surfaces of the connection electrodes 20ce, 30ce, 40ce, and 50ce, and may include an epoxy molding compound (EMC), which may be formed in various colors, such as black, white or transparent. However, the inventive concepts are not limited thereto. For example, in some exemplary embodiments, the protection layer 90 may include polyimide (PID), and in this case, PID may be provided as a dry film rather than a liquid type to increase flatness when PID is applied to the light emitting stack structure. In some exemplary embodiments, the protection layer 90 may include a photosensitive substance. In this manner, the protection layer 90 may provide a sufficient contact area to the light emitting device 100 not only to protect the light emitting structure from external impacts that may be applied during subsequent processes, but also to facilitate handling during the subsequent transfer step. In addition, the protection layer 90 may prevent light leakage from the side surface of the light emitting device 100 to prevent or at least to suppress interference of light emitted from an adjacent light emitting device 100.

Figure 2:
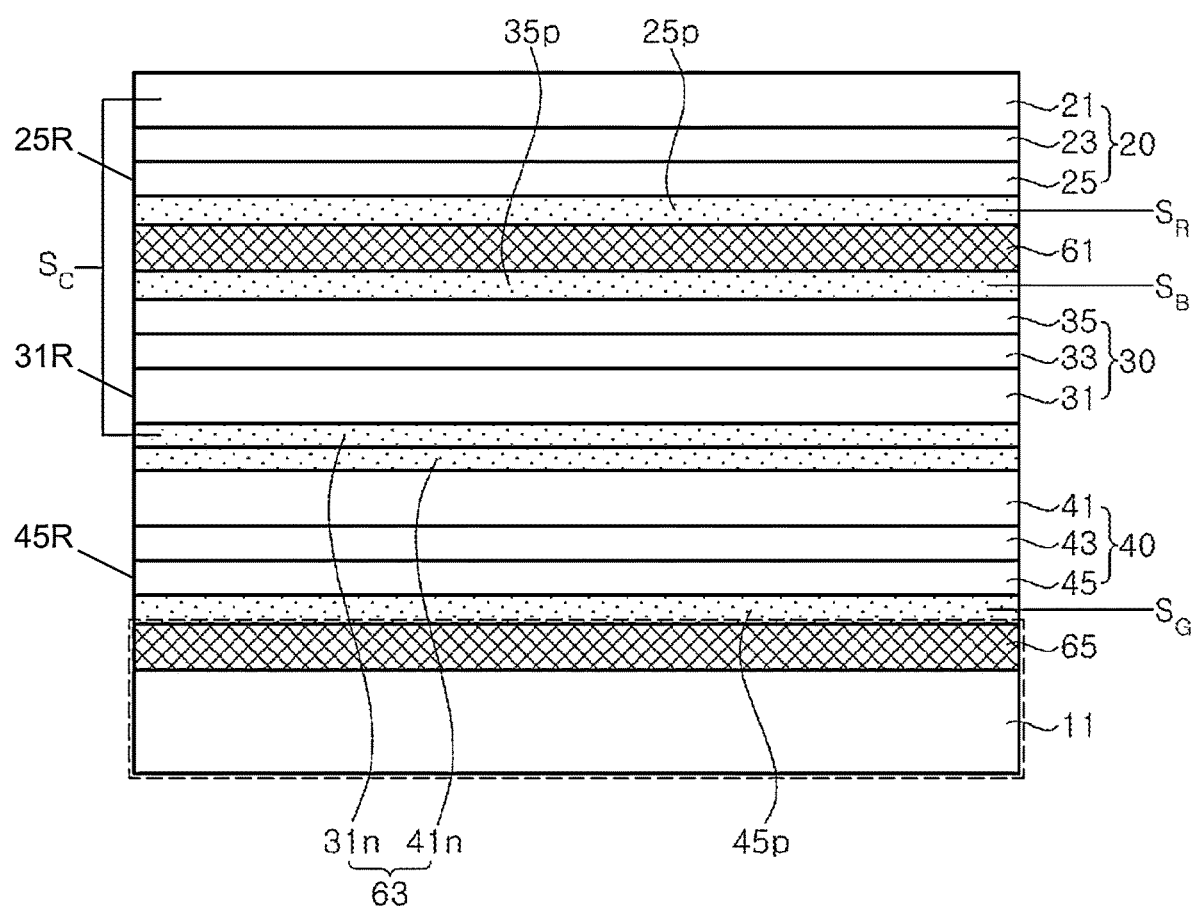
FIG. 2 is a schematic cross-sectional view of a light emitting stack structure according to an exemplary embodiment.

FIG. 2 is a schematic cross-sectional view of a light emitting stack structure according to an exemplary embodiment. Since the light emitting stack structure according to the illustrated exemplary embodiment is substantially the same as that included in the above-described light emitting device 100, repeated descriptions of the configuration that form the substantially same light emitting stack structure will be omitted to avoid redundancy. Although a first upper contact electrode 21n is not shown in FIG. 2, the first upper contact electrode 21n may be provided on the first conductivity type semiconductor layer 21 as shown in FIGS. 1C and 1D.

Referring to FIG. 2, first, second, and third lower contact electrodes 25p, 35p, and 45p according to an exemplary embodiment may be connected to individual lines SR, SG, and SB, respectively. First conductivity type semiconductor layers 21, 31, and 41 of first, second, and third light emitting stacks 20, 30, and 40 may be connected to a common line Sc. The common line Sc may be connected to the first conductivity type semiconductor layer 21 of the first light emitting stack 20 through the first upper contact electrode 21n. In addition, the common line Sc may be connected to a second adhesive layer 63 to be commonly electrically connected to the first conductivity type semiconductor layers 31 and 41.

According to an exemplary embodiment, different voltages may be applied to the first, second, and third light emitting stacks 20, 30, and 40 by having an n-common structure. For example, the first light emitting stack 20 emitting red light may be applied with a relatively low voltage compared to those applied to the second and third light emitting stacks 30 and 40 emitting blue light and green light. Therefore, a voltage source suitable for each of the light emitting stacks may be individually used to reduce power loss. In the illustrated exemplary embodiment, the first, second, and third light emitting stacks 20, 30, and 40 may be individually controlled to selectively emit light by using the individual lines SR, SG, and SB and the common line Sc.

The light emitting stack structure according to an exemplary embodiment may display light of various colors according to an operating state of each of the light emitting stacks 20, 30, and 40, whereas conventional light emitting devices may display a variety of colors in a combination of multiple light emitting cells that emit light of a single color. More specifically, conventional light emitting devices generally include light emitting cells spaced apart from one another along a two-dimensional plane and emitting light of different colors, for example, red, green, and blue, respectively, to realize a full color display. As such, a relatively large area may be occupied by conventional light emitting cells. However, the light emitting stack structure according to an exemplary embodiment may emit light having different colors by stacking a plurality of light emitting stacks 20, 30, and 40, and thus, the light emitting stack structure may provide a high level of integration and realize full color display through a smaller area than that of the conventional light emitting apparatus.

In addition, when the light emitting devices 100 are mounted on another substrate to manufacture a display apparatus, the number of devices to be mounted may be significantly reduced compared to the conventional light emitting device. As such, particularly when hundreds of thousands or millions of pixels are formed in one display apparatus, manufacturing of the display apparatus using the light emitting device 100 may be substantially simplified.

According to an exemplary embodiment, the light emitting stack structure may further include various additional elements to improve purity and efficiency of light emitted therefrom. For example, in some exemplary embodiments, a wavelength pass filter may be disposed between the light emitting stacks. In some exemplary embodiments, an irregularity portion may be formed on a light emission surface (e.g. 25R, 31R, 45R) of at least one of the light emitting stacks to balance brightness of light between the light emitting stacks. For example, luminance intensity of green light needs to be increased to make the RGB mixing ratio close to 3:6:1, and to this end, irregularities 45R may be formed in a second conductivity type semiconductor layer 45.

Hereinafter, a method of forming the light emitting device 100 according to an exemplary embodiment will be described with reference to the accompanying drawings.

FIGS. 3A, 4A, 5A, 6A, 7A, and 8A are plan views illustrating a process of manufacturing the light emitting device of FIG. 1A according to an exemplary embodiment. FIGS. 3B, 4B, 5B, 6B, 7B, and 8B are cross-sectional views taken along line A-A' of the corresponding plan views shown in FIGS. 3A, 4A, 5A, 6A, 7A, and 8A according to an exemplary embodiment. FIGS. 4C, 5C, 6C, 7C, and 8C are cross-sectional views taken along line B-B' of the corresponding plan views shown in FIGS. 3A, 4A, 5A, 6A, 7A, and 8A according to an exemplary embodiment.

Referring back to FIG. 2, the first conductivity type semiconductor layer 41, the third active layer 43, and the second conductivity type semiconductor layer 45 of the third light emitting stack 40 may be sequentially grown on a growth substrate by, for example, a metal organic chemical vapor deposition (MOCVD) method or a molecular beam epitaxy (MBE) method. The third lower contact electrode 45p may be formed on the second conductivity type semiconductor layer 45 by, for example, a physical vapor deposition or chemical vapor deposition method, and may include transparent conductive oxide (TCO), such as SnO, $InO_2$, ZnO, ITO, ITZO, or the like. When the third light emitting stack 40 emits green light according to an exemplary embodiment, the growth substrate may include $Al_2O_3$ (for example, a sapphire substrate), and the third lower contact electrode 45p may include transparent conductive oxide (TCO), such as tin oxide.

Subsequently, a substrate 11 may be attached to the third light emitting stack 40 with an adhesive layer 65 interposed there between, and the growth substrate may be removed from the third light emitting stack 40 using a laser lift-off or the like. As the growth substrate is removed, the first conductivity type semiconductor layer 41 is exposed, and a transparent conductive oxide layer 41n such as ITO may be formed on the exposed first conductivity type semiconductor layer 41.

The second light emitting stack 30 may be formed through a process similar to that forming the third light emitting stack 40. The second light emitting stack 30 may be coupled to a temporary substrate, and a transparent conductive oxide layer 31n such as ITO may be formed on the first conductivity type semiconductor layer 31, which may be exposed by removing a growth substrate of the second light emitting stack 30.

The transparent conductive oxide layer 41n on the third light emitting stack 40 and the transparent conductive oxide layer 31n on the second light emitting stack 30 may be bonded to each other to form the adhesive layer 63, and the temporary substrate on the light emitting stack 30 may be removed.

Meanwhile, the first light emitting stack 20 may be similarly formed by sequentially growing the first conductivity type semiconductor layer 21, the active layer 23, and the second conductivity type semiconductor layer 25 on a growth substrate. The lower contact electrode 25p including transparent conductive oxide (TCO) may be formed by, for example, a physical vapor deposition or chemical vapor deposition method on the second conductivity type semiconductor layer 25, respectively. In addition, the first light emitting stack 20 may be bonded to the second light emitting stack 30 with the first adhesive layer 61 interposed there between, and the growth substrate may be removed by a chemical process, a mechanical process, or the like.

Although the second light emitting stack 30 and the third light emitting stack 40 are described above as being bonded first, and then the first light emitting stack 20 is described as being bonded to the second light emitting stack 30, the inventive concepts are not limited thereto, and the above sequences may be changed. For example, the first light emitting stack 20 and the second light emitting stack 30 may be bonded first, and then, the third light emitting stack 40 may be bonded to the second light emitting stack 30 in other exemplary embodiments.

Figure 3A:
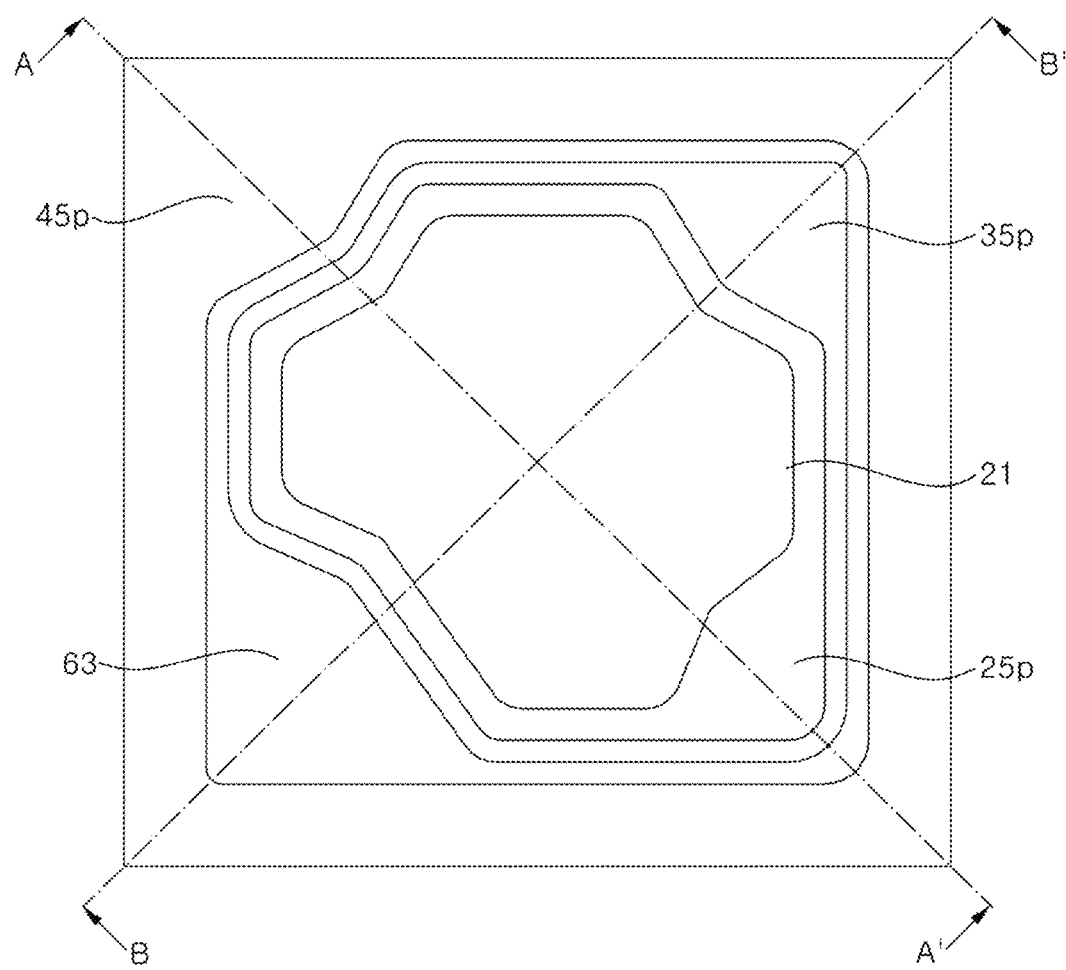
FIGS. 3A, 4A, 5A, 6A, 7A, and 8A are plan views illustrating a process of manufacturing the light emitting device of FIG. 1A according to an exemplary embodiment.
Figure 3B:
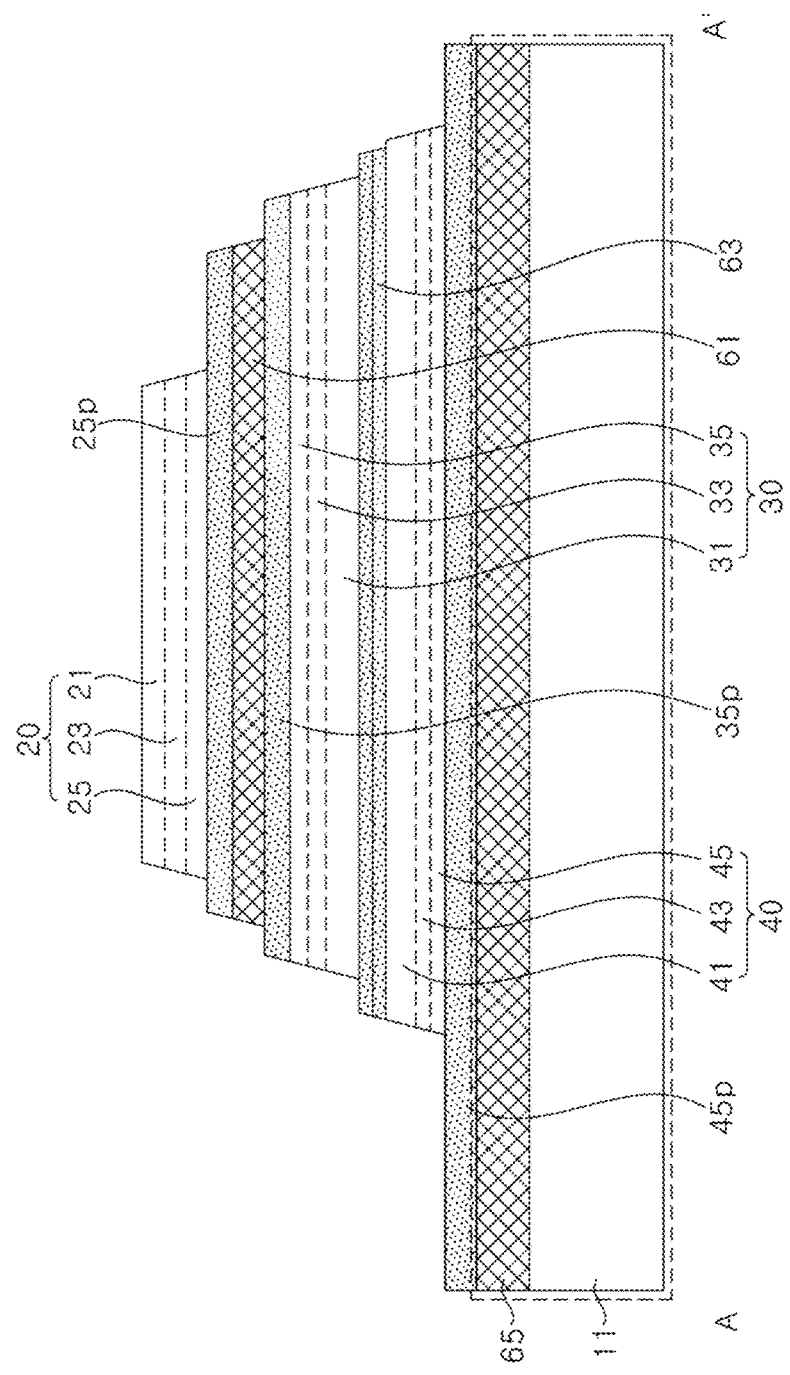
FIGS. 3B, 4B, 5B, 6B, 7B, and 8B are cross-sectional views taken along line A-A' of the corresponding plan views shown in FIGS. 3A, 4A, 5A, 6A, 7A, and 8A according to an exemplary embodiment.
Figure 3C:
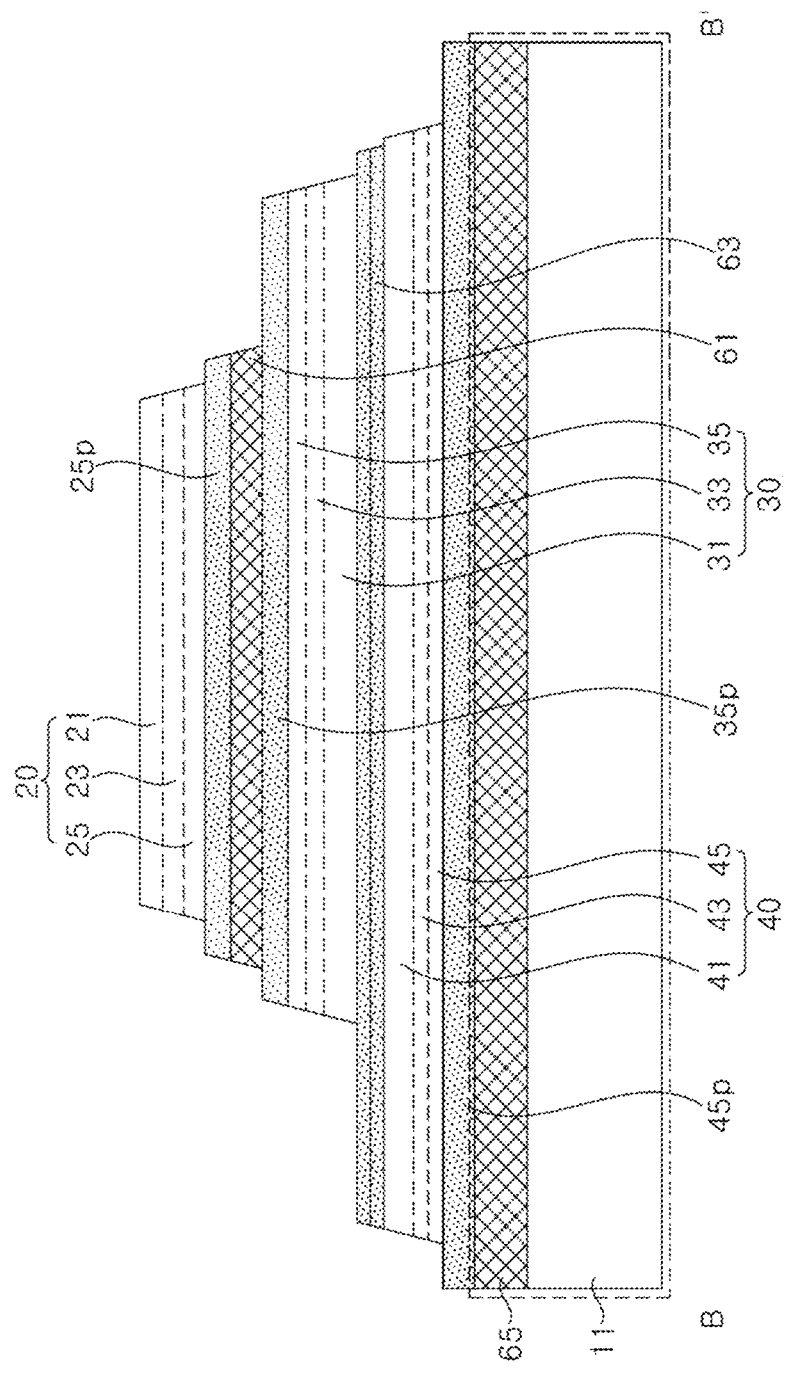
FIGS. 3C, 4C, 5C, 6C, 7C, and 8C are cross-sectional views taken along line B-B' of the corresponding plan views shown in FIGS. 3A, 4A, 5A, 6A, 7A, and 8A according to an exemplary embodiment.

Subsequently, referring to FIGS. 3A, 3B, and 3C, various portions of each of the first, second, and third light emitting stacks 20, 30, and 40 may be patterned through an etching process or the like to expose portions of a first conductivity type semiconductor layer 21, a first lower contact electrode 25p, a second lower contact electrode 35p, a third lower contact electrode 45p, and a second adhesive layer 63. In some exemplary embodiments, instead of the second adhesive layer 63, a portion of the first conductivity type semiconductor layer 31 or the first conductivity type semiconductor layer 41 may be exposed. According to the illustrated exemplary embodiment, the first light emitting stack 20 has the smallest area among the light emitting stacks 20, 30, and 40. The third light emitting stack 40 may have the largest area among the light emitting stacks 20, 30, and 40, and thus, luminance intensity of the third light emitting stack 40 may be relatively increased. However, the inventive concepts are not particularly limited to the relative sizes of the light emitting stacks 20, 30, and 40.

Figure 4A:
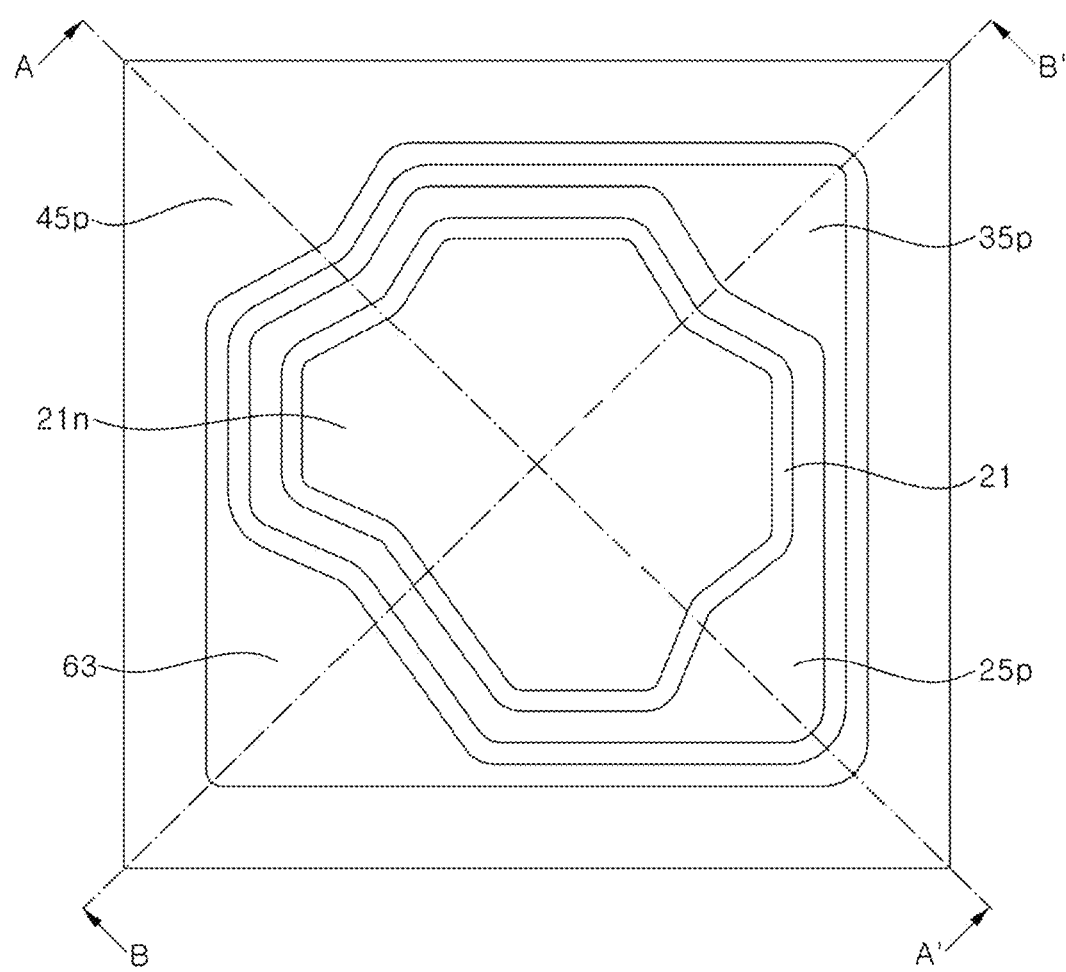
Figure 4B:
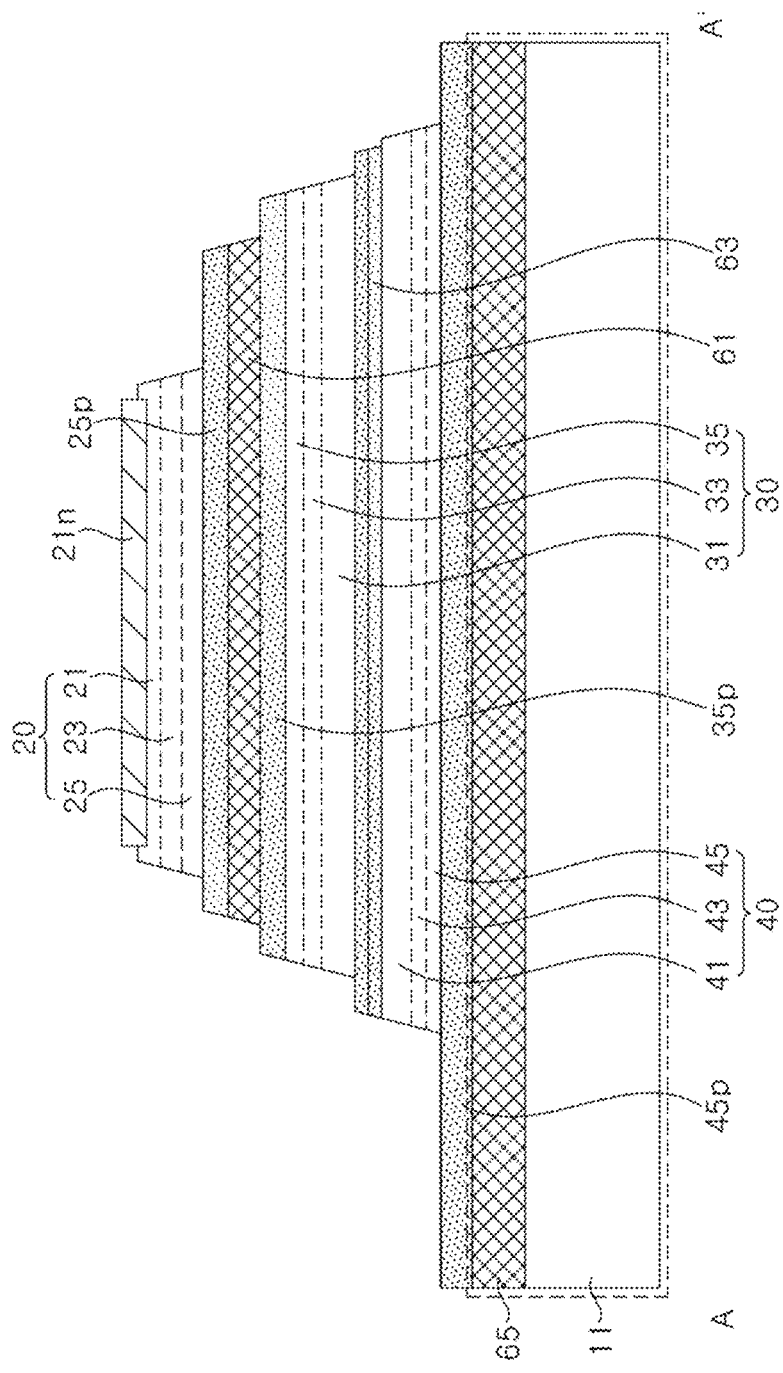
Figure 4C:
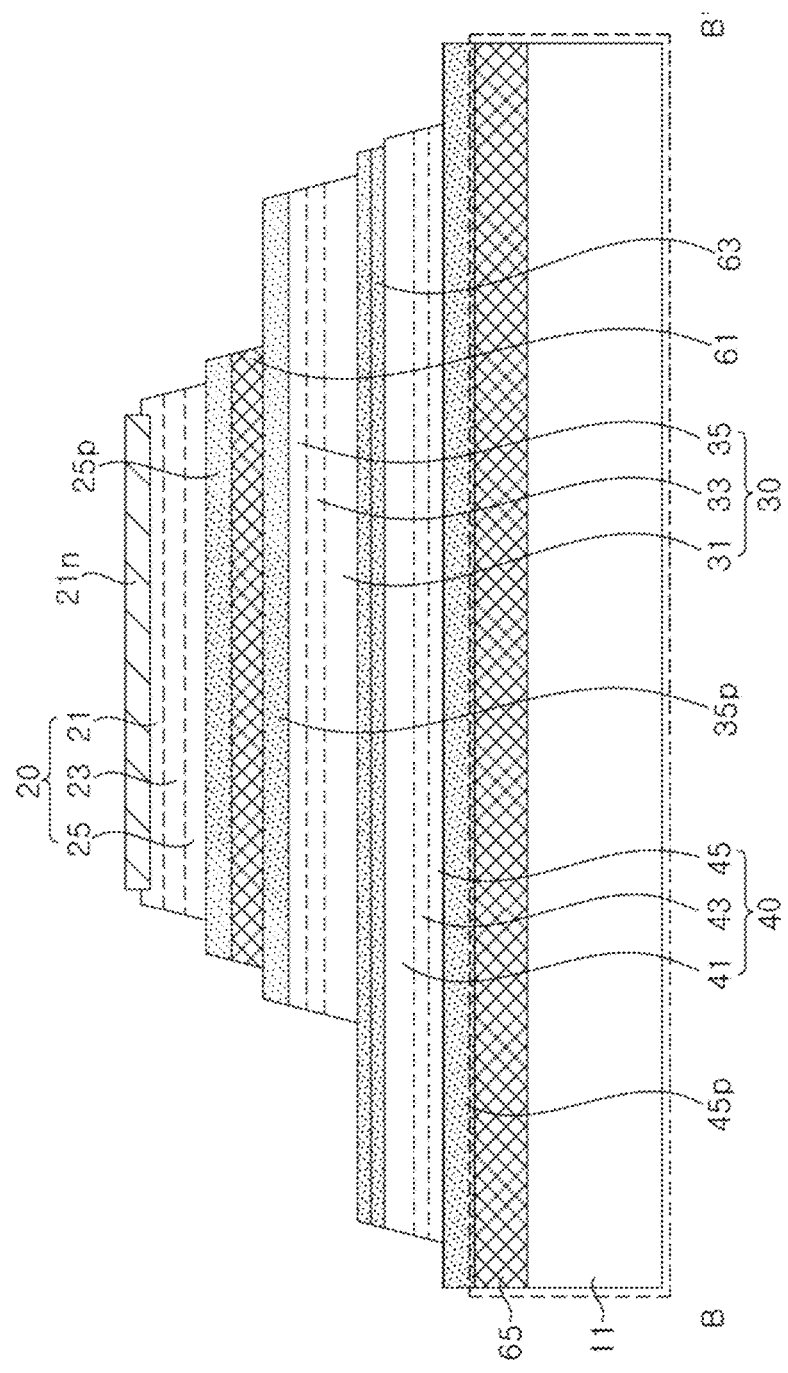

Referring to FIGS. 4A, 4B, and 4C, a portion of an upper surface of the first conductivity type semiconductor layer 21 of the first light emitting stack 20 may be patterned through wet etching to form a first upper contact electrode 21n. As described above, the first upper contact electrode 21n is formed to have a thickness of about 100 nm in the recessed region of the first conductivity type semiconductor layer 21, which may improve an ohmic contact there between.

Figure 5A:
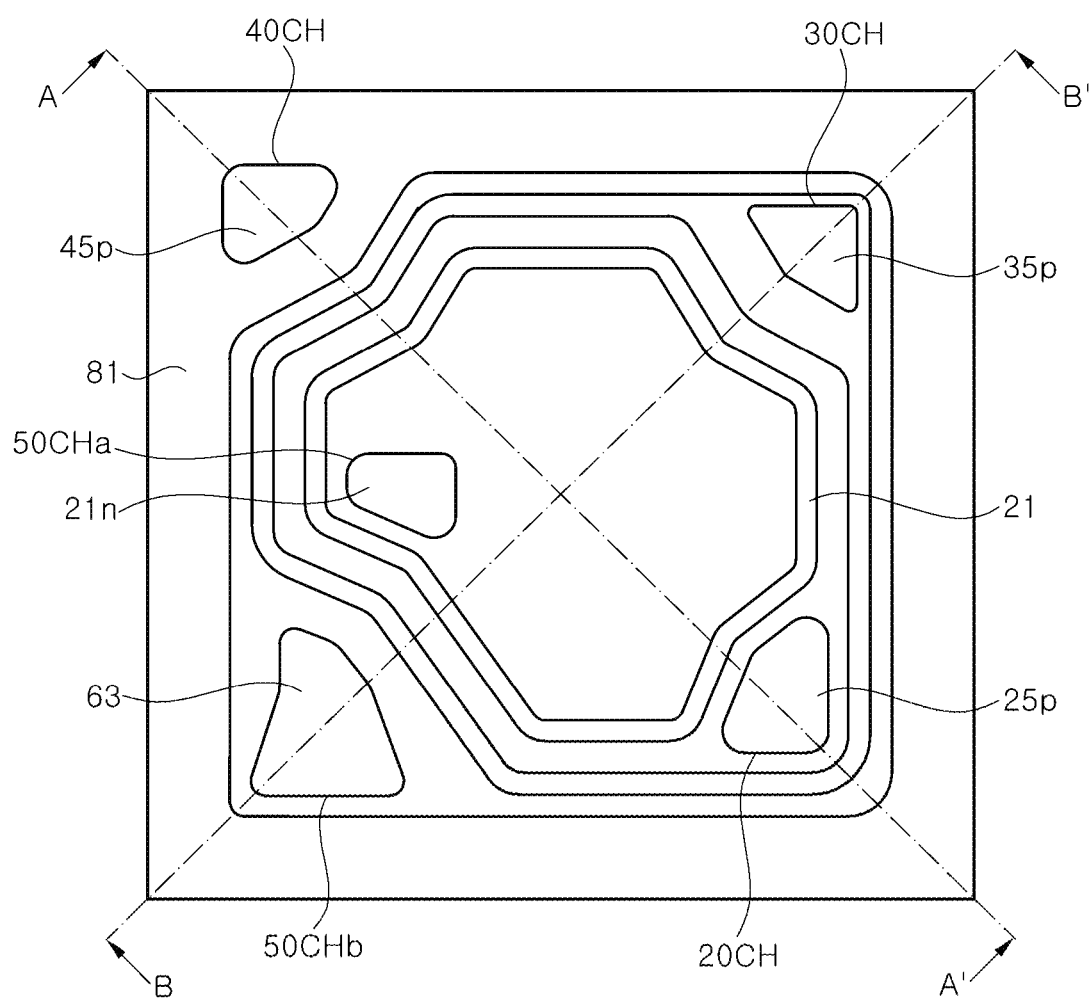
Figure 5B:
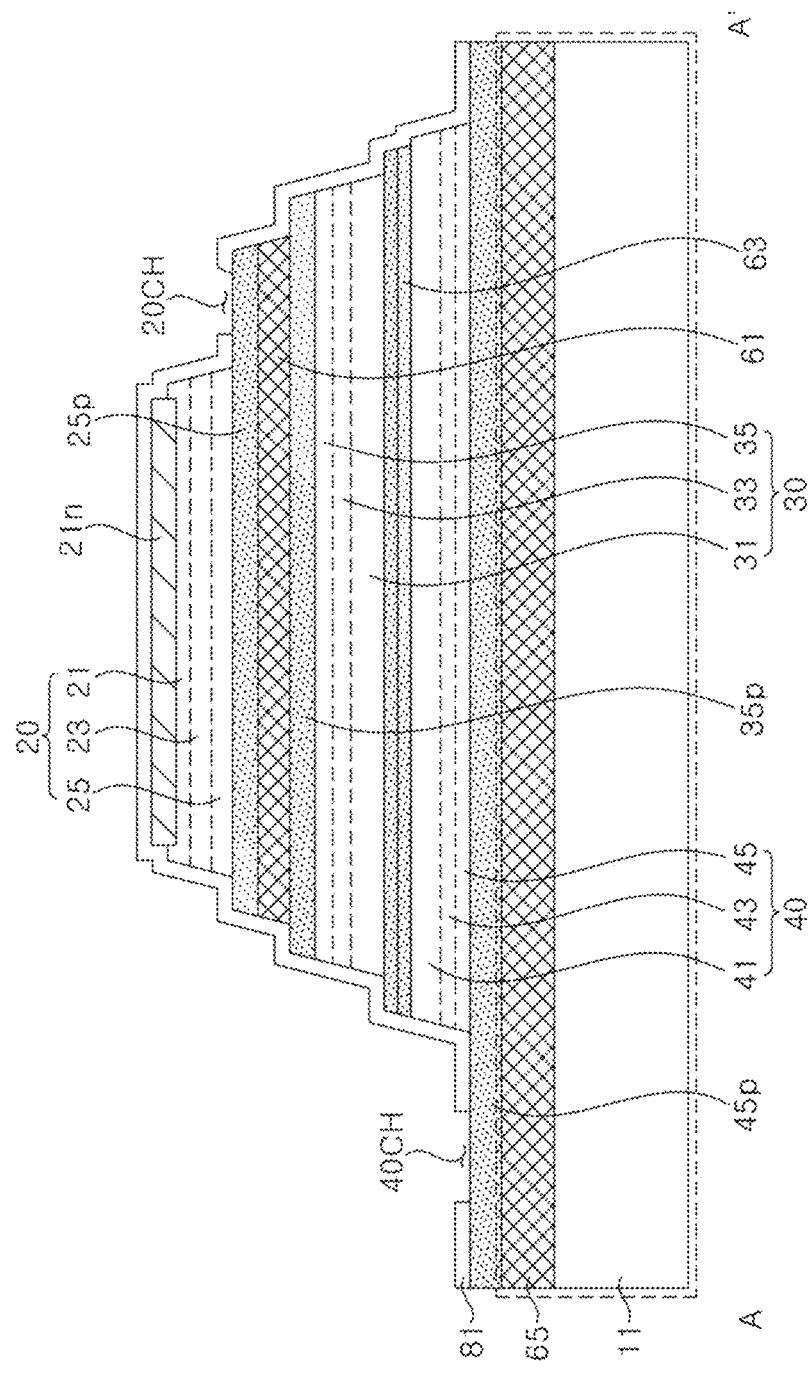
Figure 5C:
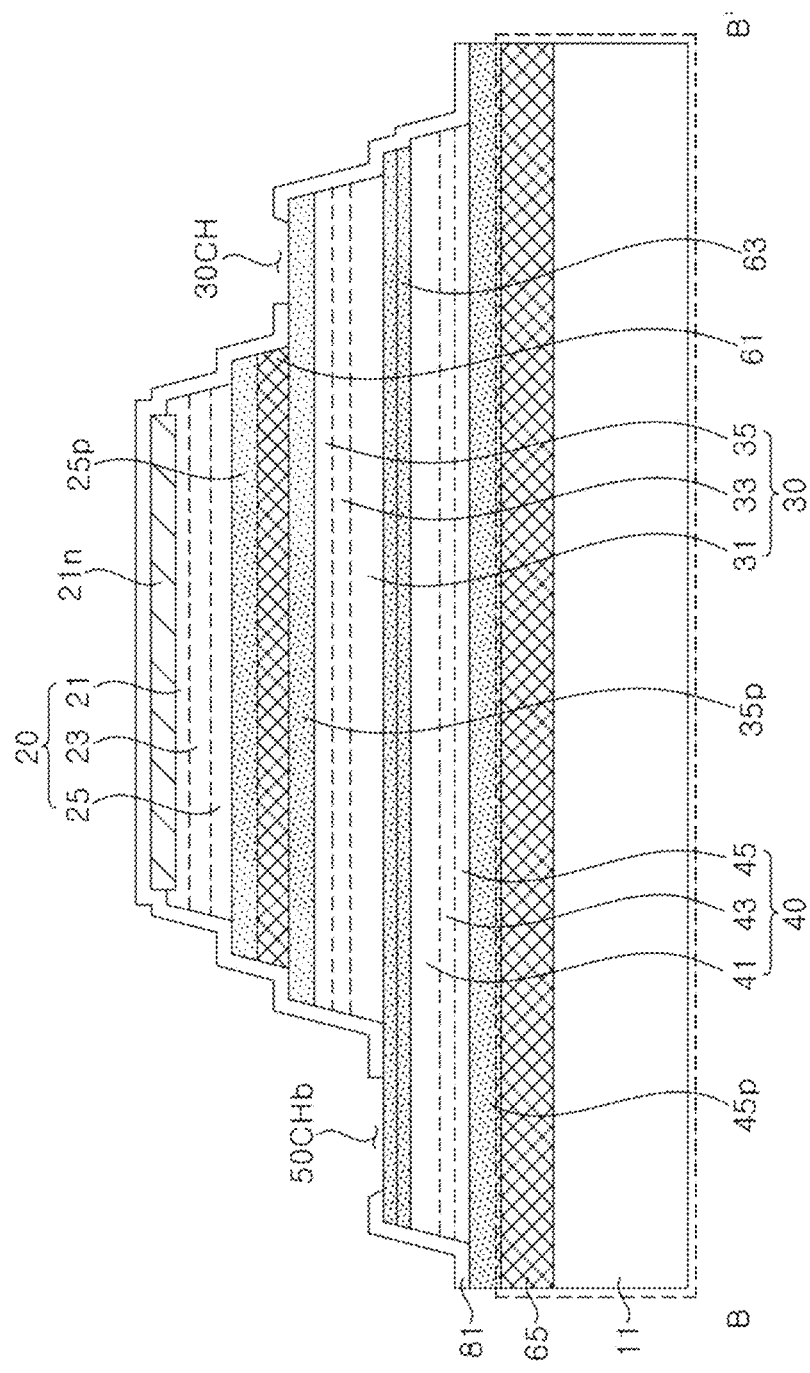

Referring to FIGS. 5A, 5B, and 5C, a first insulation layer 81 may be formed to cover the light emitting stacks 20, 30, and 40, and a portion of the first insulation layer 81 may be removed to form first, second, third, and fourth contact holes 20CH, 30CH, 40CH, and 50CH. The first contact hole 20CH is defined on the first lower contact electrode 25p to expose a portion of the first lower contact electrode 25p. The second contact hole 30CH is defined on the second lower contact electrode 35p and may expose the second lower contact electrode 35p. The third contact hole 40CH is defined on the third lower contact electrode 45p and may expose the third lower contact electrode 45p.

A fourth contact hole 50CH provides a passage for electrical connection to the first conductivity type semiconductor layers 21, 31, and 41 of the first, second, and third light emitting stacks 20, 30, and 40. The fourth contact hole 50CH may include a first sub-contact hole 50CHa and a second sub-contact hole 50CHb. The first sub-contact hole 50CHa may be defined on the first conductivity type semiconductor layer 21 to expose a portion of the first upper contact electrode 21n, and the second sub-contact hole 50CHb may be defined on the second adhesive layer 63 to expose a portion of the second adhesive layer 63.

Figure 6A:
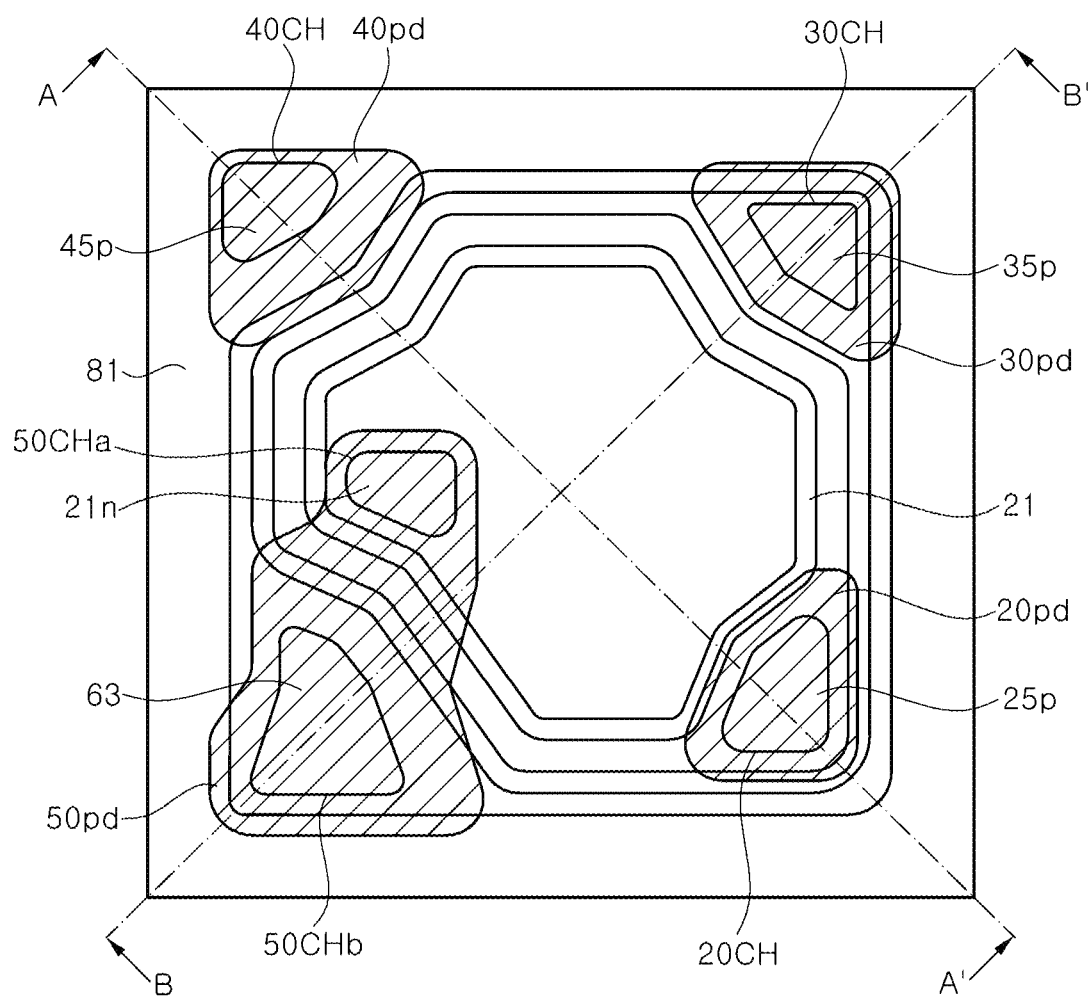
Figure 6B:
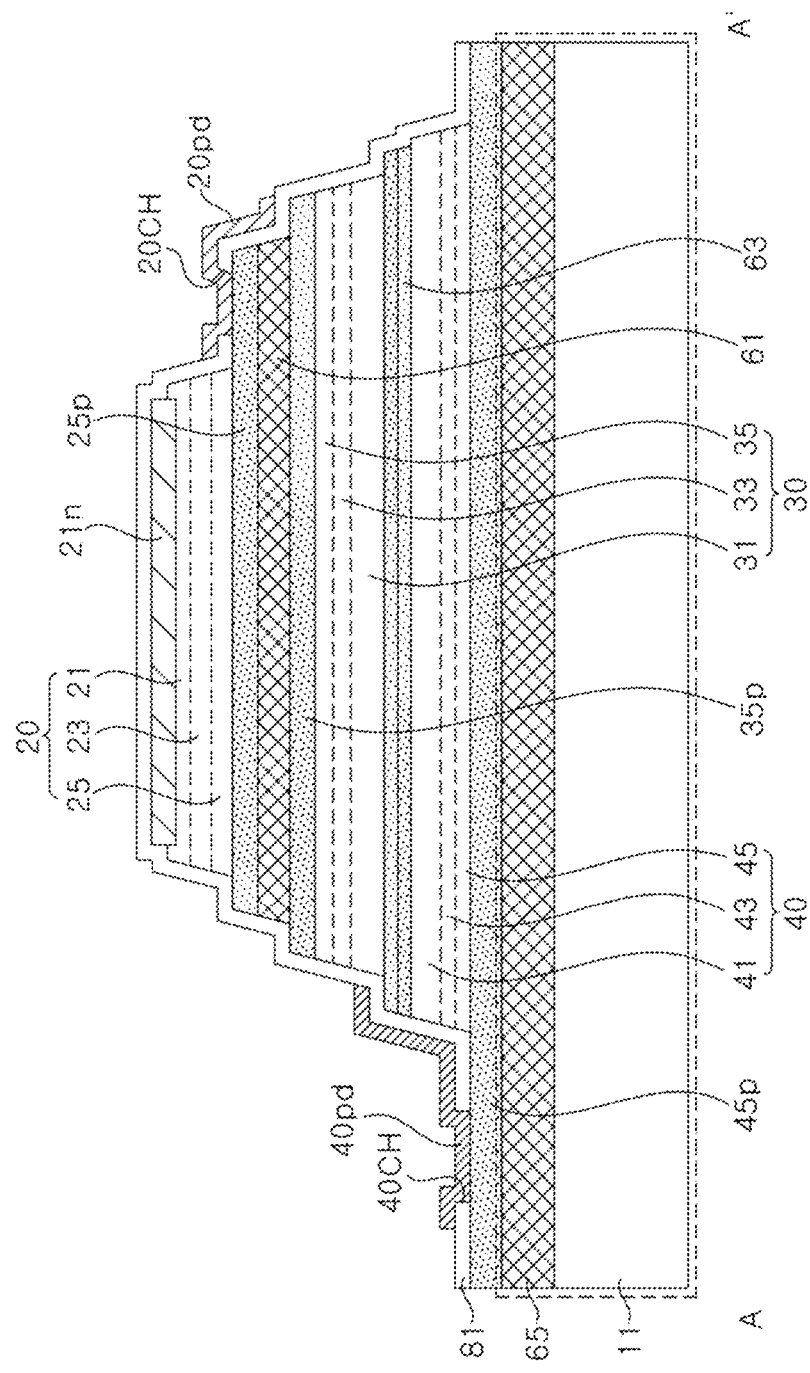
Figure 6C:
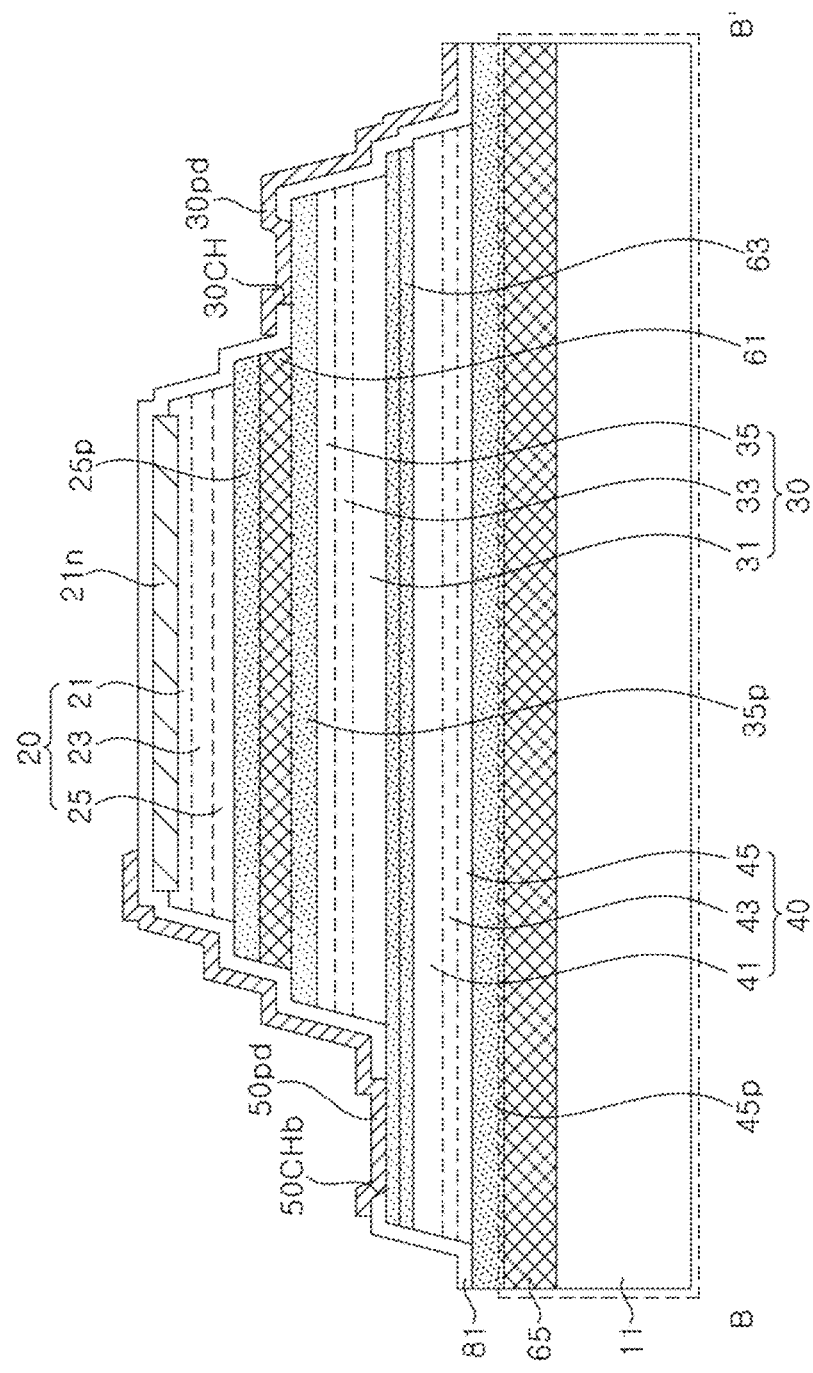

Referring to FIGS. 6A, 6B, and 6C, first, second, third, and fourth pads 20pd, 30pd, 40pd, and 50pd are formed on the first insulation layer 81 in which the first, second, third, and fourth contact holes 20CH, 30CH, 40CH, and 50CH are formed. The first, second, third, and fourth pads 20pd, 30pd, 40pd, and 50pd may be formed, for example, by forming a conductive layer on a substantially entire surface of the substrate 11, and then patterning the conductive layer using a photolithography process.

The first pad 20pd may be formed to overlap with a region where the first contact hole 20CH is formed, and may be connected to the first lower contact electrode 25p through the first contact hole 20CH. The second pad 30pd may be formed to overlap with a region where the second contact hole 30CH is formed, and may be connected to the second lower contact electrode layer 35p through the second contact hole 30CH. The third pad 40pd may be formed to overlap with a region where the third contact hole 40CH is formed, and may be connected to the third lower contact electrode 45p through the third contact hole 40CH. The fourth pad 50pd may be formed to overlap with a region where the fourth contact hole 50CH is formed, particularly regions where the first and second sub-contact holes 50CH and 50CHb are formed, and may be electrically connected to the first conductivity type semiconductor layers 21, 31, and 41 of the light emitting stacks 20, 30, and 40.

Figure 7A:
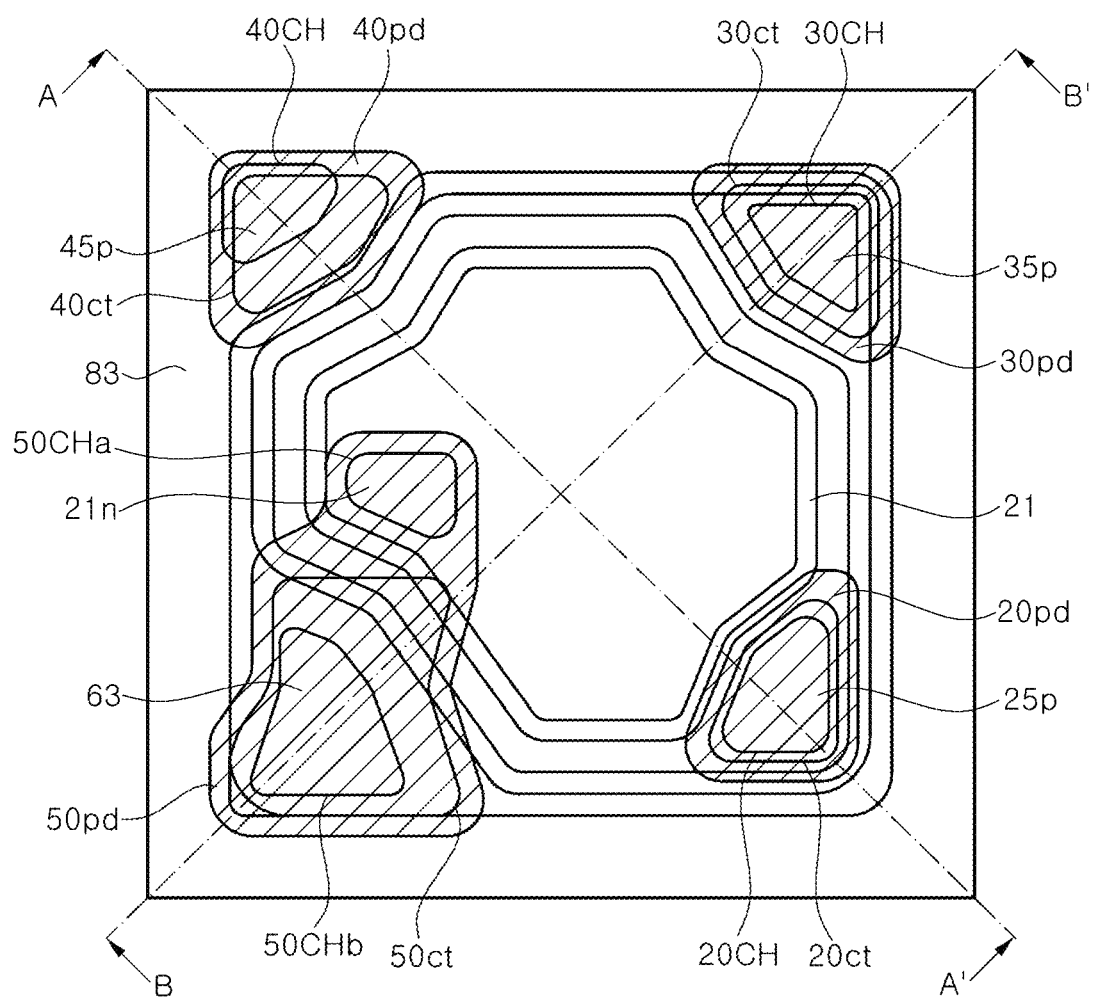
Figure 7B:
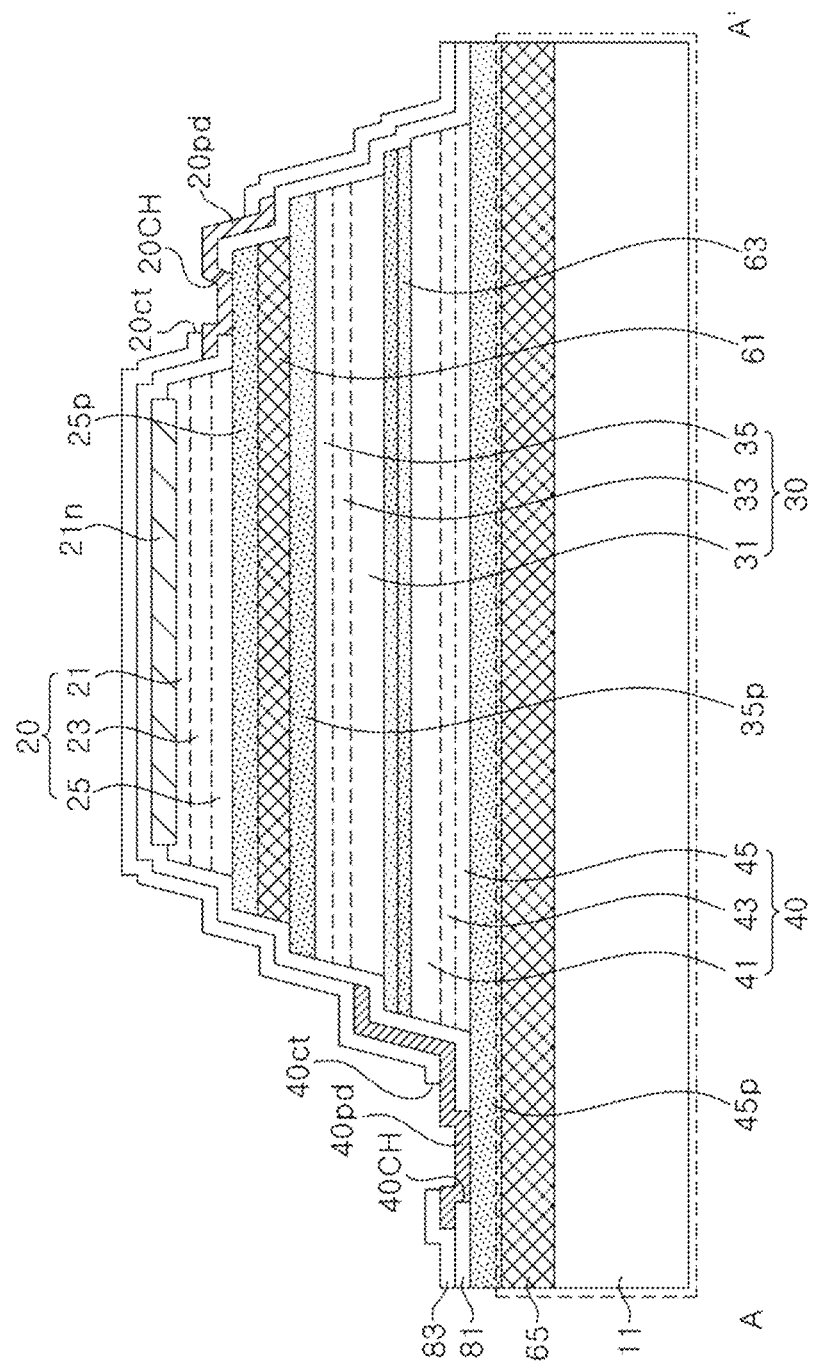
Figure 7C:
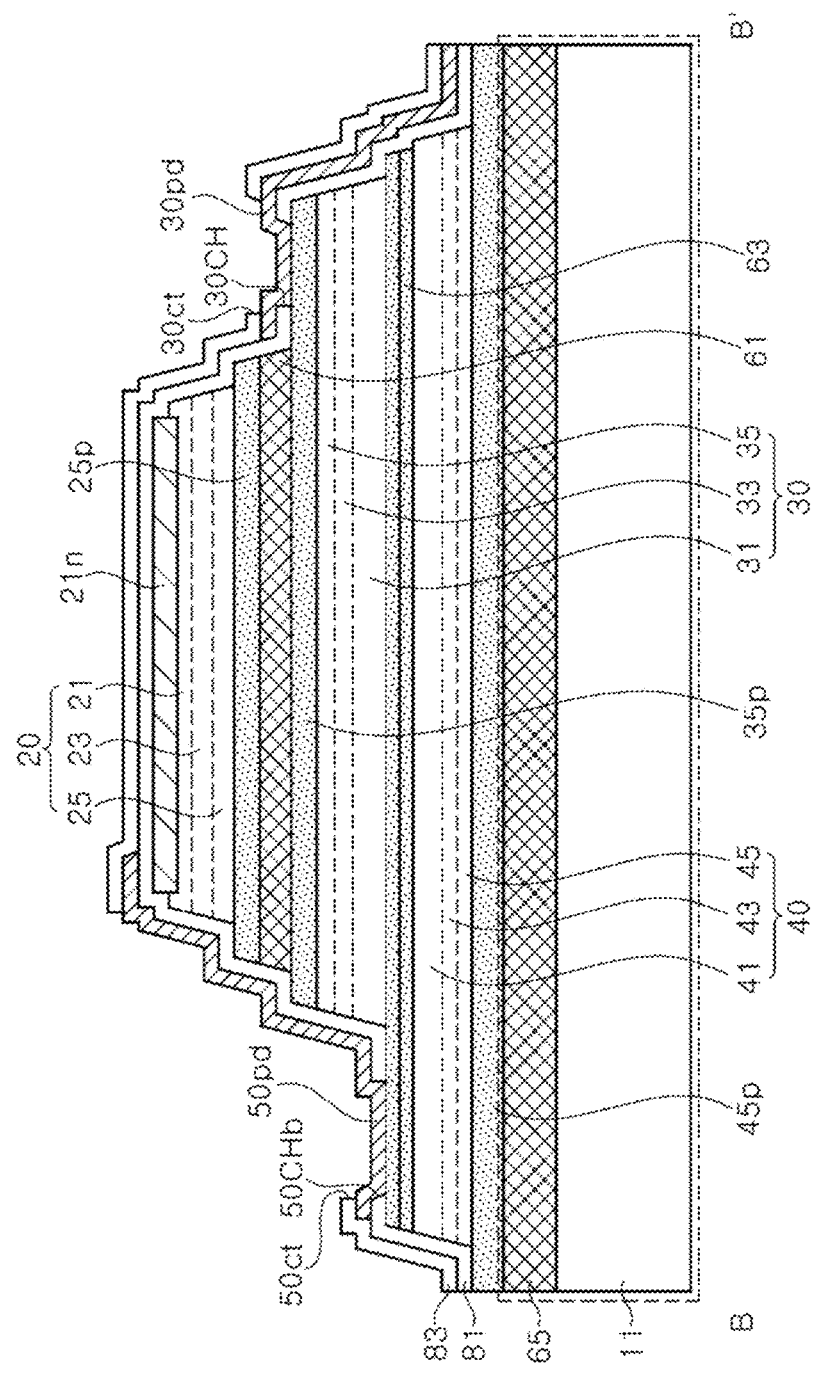

Referring to FIGS. 7A, 7B, and 7C, a second insulation layer 83 may be formed on the first insulation layer 81. The second insulation layer 83 may include silicon oxide and/or silicon nitride. However, the inventive concepts are not limited thereto, and in some exemplary embodiments, the first and second insulation layers 81 and 83 may include inorganic materials. Subsequently, the second insulation layer 83 may be patterned and first, second, third, and fourth through holes 20ct, 30ct, 40ct, and 50ct exposing the first, second, third, and fourth pads 20pd, 30pd, 40pd, and 50pd may be formed.

The first through hole 20ct formed on the first pad 20pd exposes a portion of the first pad 20pd. The second through hole 30ct formed on the second pad 30pd exposes a portion of the second pad 30pd. The third through hole 40ct formed on the third pad 40pd exposes a portion of the third pad 40pd. The fourth through hole 50ct formed on the fourth pad 50pd exposes a portion of the fourth pad 50pd. In the illustrated exemplary embodiment, the first, second, third, and fourth through holes 20ct, 30ct, 40ct, and 50ct may be defined within regions where the first, second, third, and fourth pads 20pd, 30pd, 40pd, and 50pd are formed, respectively.

Figure 8A:
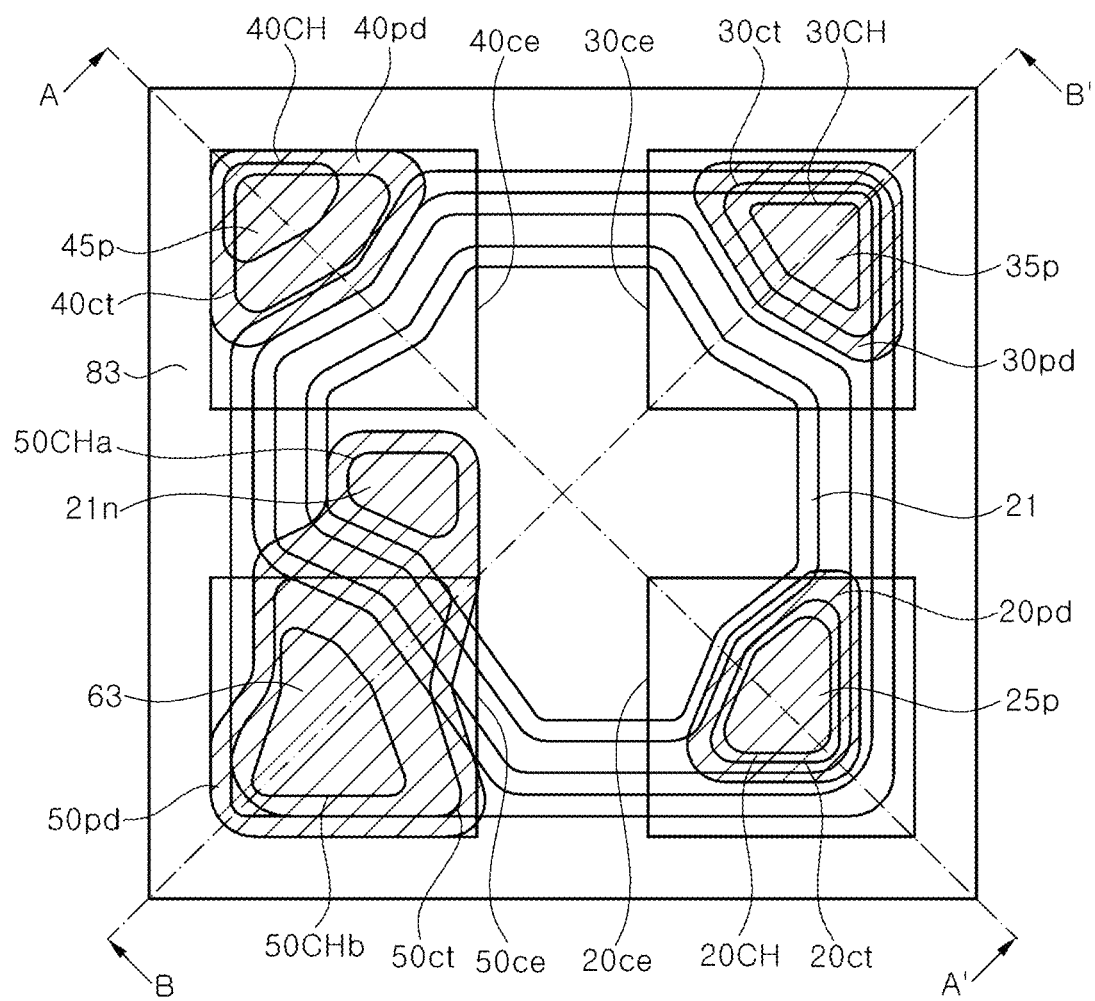
Figure 8B:
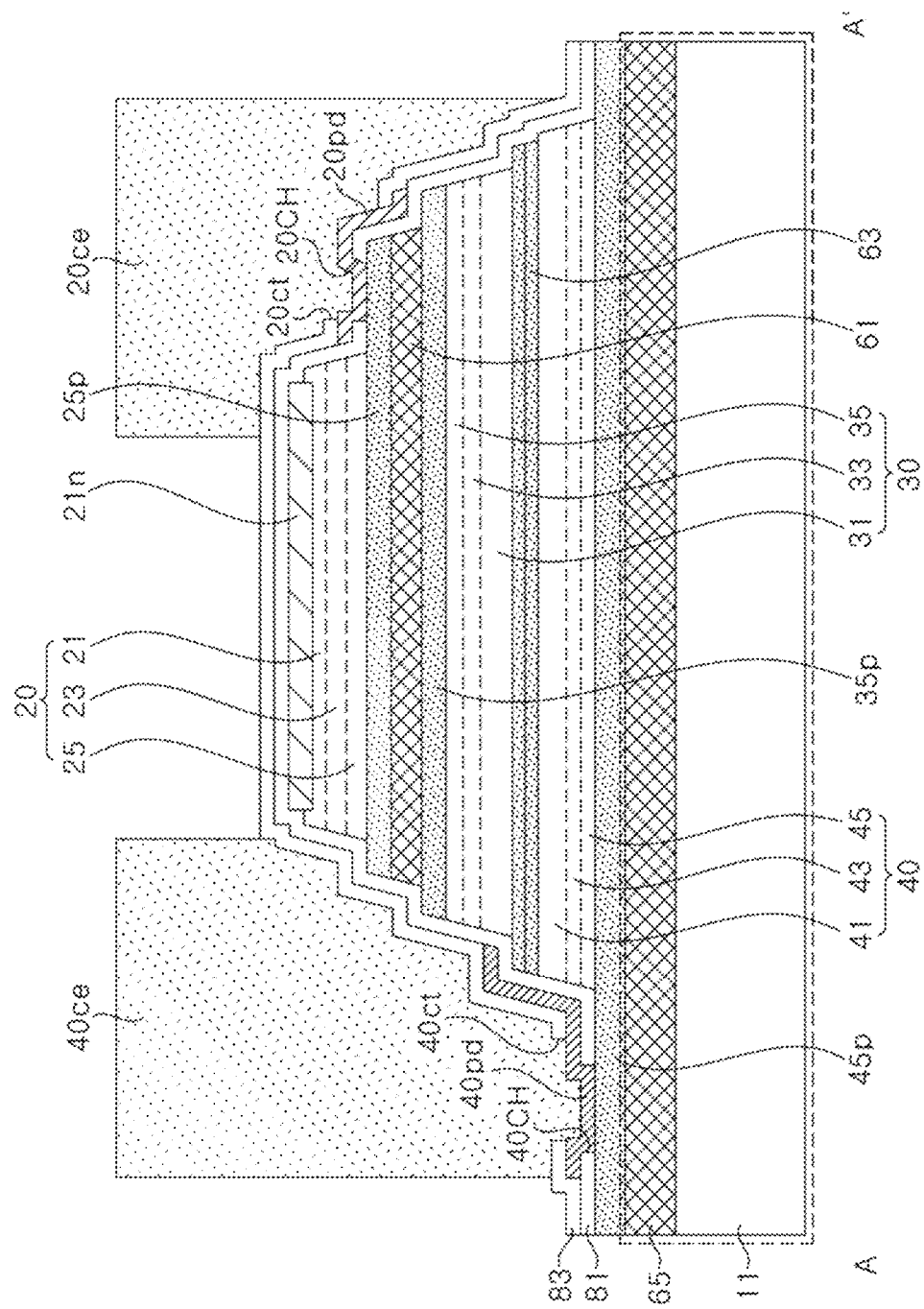
Figure 8C:
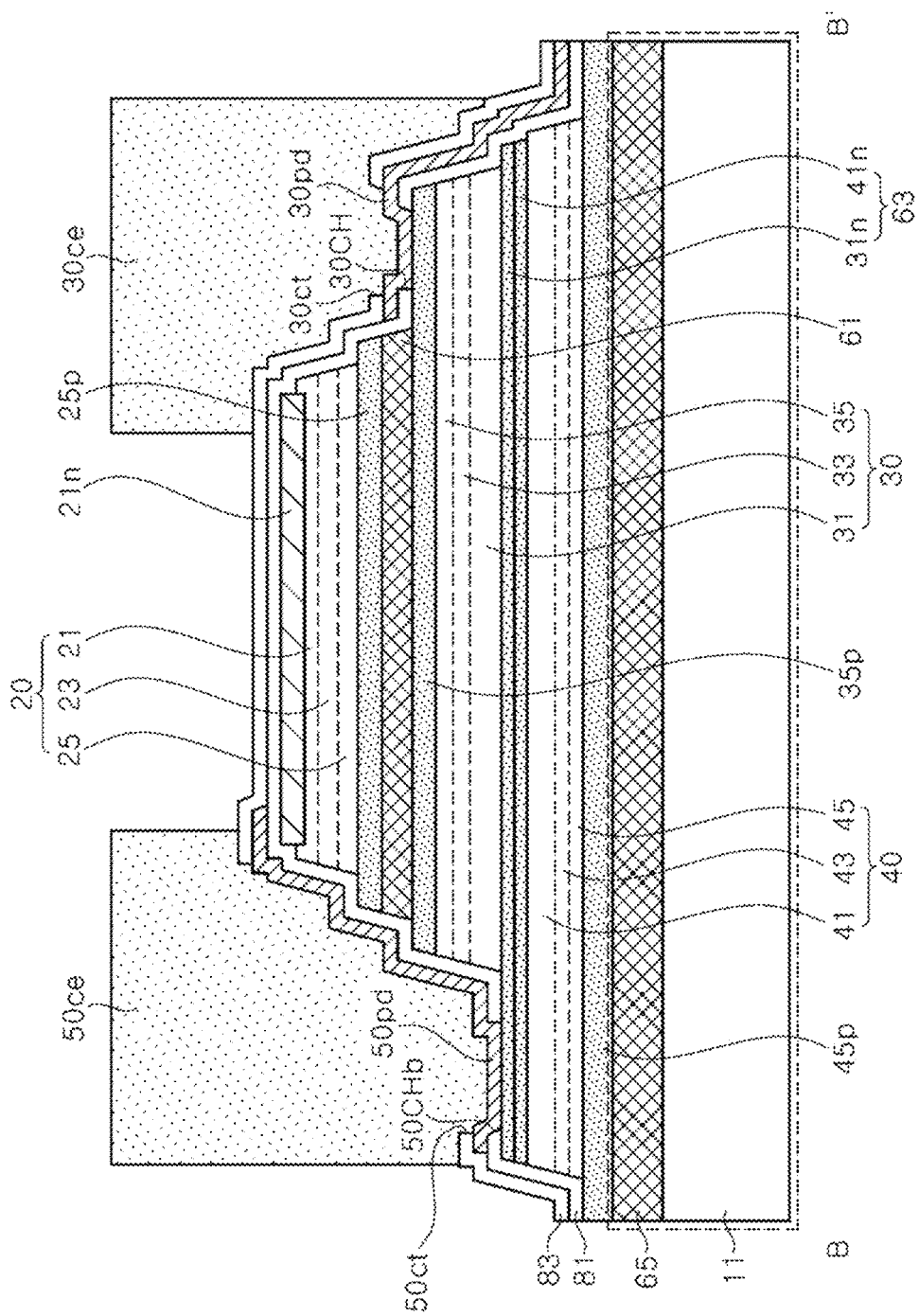

Referring to FIGS. 8A, 8B, and 8C, first, second, third, and fourth connection electrodes 20ce, 30ce, 40ce, and 50ce are formed on the second insulation layer 83, on which the first, second, third and fourth through holes 20ct, 30ct, 40ct, and 50ct are formed. The first connection electrode 20ce may be formed to overlap with a region where the first through hole 20ct is formed, and may be connected to the first pad 20pd through the first through hole 20ct. The second connection electrode 30ce may be formed to overlap with a region where the second through hole 30ct is formed, and may be connected to the second pad 30pd through the second through hole 30ct. The third connection electrode 40ce may be formed to overlap with a region where the third through hole 40ct is formed, and may be connected to the third pad 40pd through the third through hole 40ct. The fourth connection electrode 50ce may be formed to overlap with a region where the fourth through hole 50ct is formed, and may be connected to the fourth pad 50pd through the fourth through hole 50ct.

The first, second, third, and fourth connection electrodes 20ce, 30ce, 40ce, and 50ce a may be spaced apart from one another and formed on the light emitting stack structure. The first, second, third, and fourth connection electrodes 20ce, 30ce, 40ce, and 50ce may be electrically connected to the first, second, third, and fourth pads 20pd, 30pd, 40pd, and 50pd, respectively, and transmit an external signal to each of the light emitting stacks 20, 30, and 40.

A method of forming the first, second, third, and fourth connection electrodes 20ce, 30ce, 40ce, and 50ce is not particularly limited. For example, according to an exemplary embodiment, a seed layer is deposited as a conductive surface on the light emitting stack structure, and a photoresist pattern may be formed so that the seed layer is exposed at a location where connection electrodes will be formed. According to an exemplary embodiment, the seed layer may be deposited to have a thickness of about 1000 Å, but the inventive concepts are not limited thereto. Subsequently, the seed layer may be plated with metal, such as Cu, Ni, Ti, Sb, Zn, Mo, Co, Sn, Ag or an alloy thereof, and the photoresist pattern and the seed layer that remain between the connection electrodes may be removed. In some exemplary embodiments, to prevent or at least inhibit oxidation of the plated metal, an additional metal may be deposited or plated with electroless nickel immersion gold (ENIG) or the like on the plated metal (for example, connection electrodes). In some exemplary embodiments, the seed layer may be retained on each of the connection electrodes 20ce, 30ce, 40ce, and 50ce.

According to the illustrated exemplary embodiment, each of the connection electrodes 20ce, 30ce, 40ce, and 50ce may have a substantially elongated shape to be spaced apart from the substrate 11. In another exemplary embodiment, the connection electrodes 20ce, 30ce, and 40ce may include two or more metals or a plurality of different metal layers to reduce stress from the elongated shape of the connection electrodes 20ce, 30ce, 40ce, and 50ce. However, the inventive concepts are not limited to a specific shape of the connection electrodes 20ce, 30ce, 40ce, and 50ce, and in some exemplary embodiments, the connection electrode may have various shapes.

As shown in the drawings, each of the connection electrodes 20ce, 30ce, 40ce, and 50ce may have a substantially flat upper surface to facilitate electrical connection between the light emitting stack structure and outer lines or electrodes. The connection electrodes 20ce, 30ce, 40ce, and 50ce may be overlapped with at least one step formed on the side surface of the light emitting stack structure. In this manner, a lower surface of the connection electrode may provide a larger contact area between the connection electrodes 20ce, 30ce, 40ce and 50ce and the light emitting stack structure, and thus, the light emitting device 100 along with a protection layer 90 may have a more stable structure that is capable of withstanding various subsequent processes. In this case, a length of one side surface of the connection electrodes 20ce, 30ce, 40ce, and 50ce that faces to the outside and a length of another surface that faces a center of the light emitting device 100 may be different. For example, a difference in lengths between two surfaces of the connection electrode opposite to each other may be about 3 µm to about 16 µm, but the inventive concepts are not limited thereto.

Then, the protection layer 90 is disposed between the connection electrodes 20ce, 30ce, 40ce, and 50ce. The protection layer 90 may be formed to be substantially flush with the upper surfaces of the connection electrodes 20ce, 30ce, 40ce, and 50ce by a polishing process or the like. According to an exemplary embodiment, the protection layer 90 may include a black epoxy molding compound (EMC), but the inventive concepts are not limited thereto. For example, in some exemplary embodiments, the protection layer 90 may include a photosensitive polyimide dry film (PID). In this manner, the protection layer 90 may provide a sufficient contact area to the light emitting device 100 not only to protect the light emitting structure from external impacts that may be applied during subsequent processes, but also to facilitate handling during a subsequent transferring step. In addition, the protection layer 90 may prevent light leakage from the side surface of the light emitting device 100 to prevent or at least to suppress interference of light emitted from adjacent light emitting devices 100.

A plurality of light emitting devices 100 may be formed on a single substrate 11, and the light emitting devices 100 may be divided into individual light emitting devices 100 through a singularization process. In an exemplary embodiment, after the protection layer 90 is formed on the substrate 11, the individual light emitting devices 100 may be manufactured by dividing the substrate 11 together with the protection layer 90 using a laser scribing and breaking technology. In another exemplary embodiment, after the protection layer 90 is formed, the individual light emitting devices 100 may be manufactured by separating the substrate 11 and the third adhesive layer 65 and dividing the protection layer 90.

The plurality of light emitting devices 100 may be attached to a tape or the like before the dividing process, and the tape may be expanded so that the light emitting devices 100 may be spatially spaced apart from one another after being divided into individual light emitting devices.

Figure 9B:
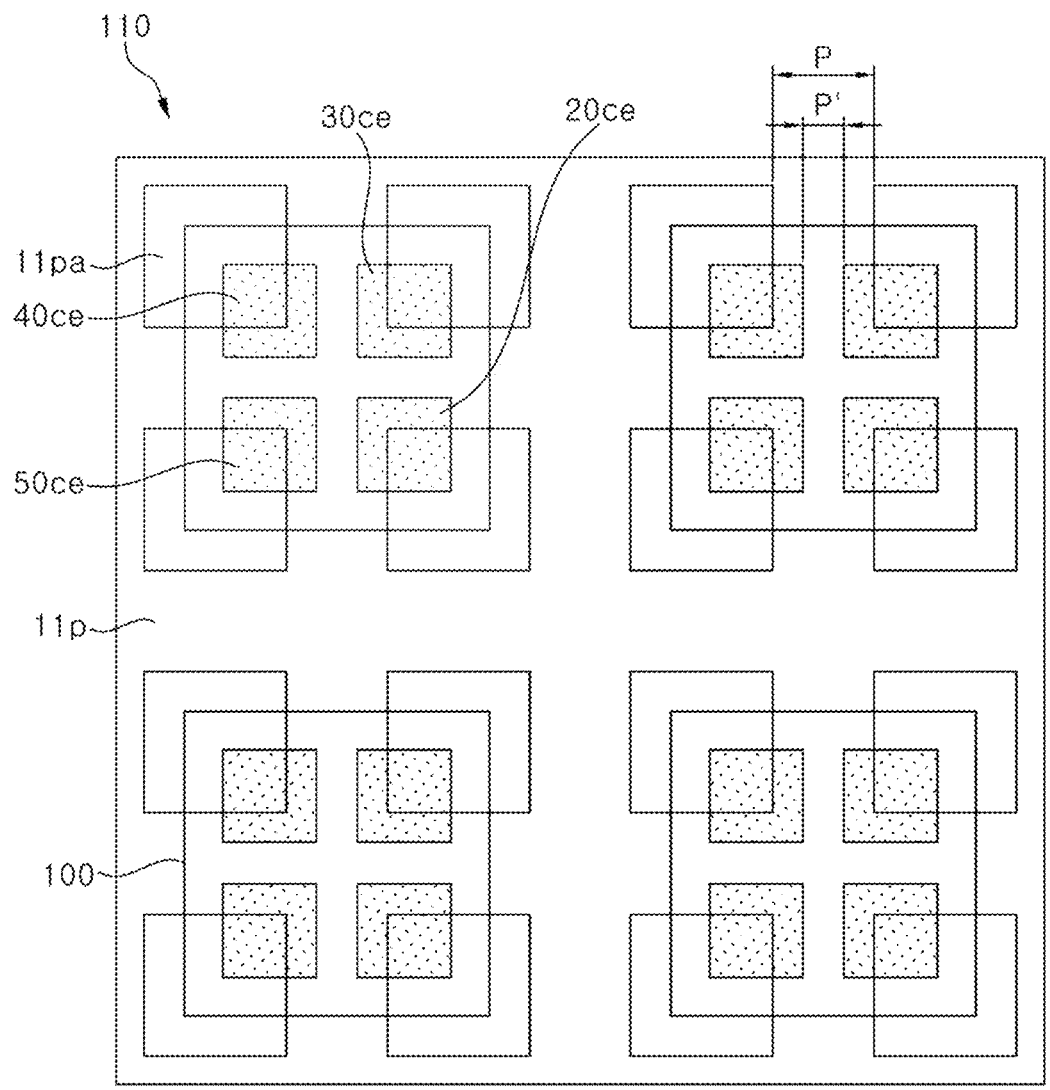

FIGS. 9A and 9B are a cross-sectional view and a plan view schematically illustrating a light emitting package according to an exemplary embodiment.

According to an exemplary embodiment, the singularized light emitting device 100 may be transferred first to a carrier substrate and disposed thereon. In this case, when the light emitting device 100 includes connection electrodes protruding outward from the light emitting stack structure without the protection layer 90, various problems may occur in subsequent processes, particularly in a transfer process, due to the non-uniform structure as described above. In addition, when the light emitting device 100 includes micro-LEDs having a surface area of about 10,000 $\mu m^2$ or less, about 4,000 $\mu m^2$ or less, or about 2,500 $\mu m^2$ or less, depending on the application, handling of the light emitting device may be more difficult due to its small form factor. However, according to the exemplary embodiments, since the light emitting device 100 is provided with the protection layer 90 disposed between the connection electrodes 20ce, 30ce, 40ce, and 50ce, handling of the light emitting device 100 may be facilitated during subsequent processes such as transfer and packaging. In addition, the light emitting structure may be protected from external impact, and interference of light between adjacent light emitting devices 100 may be prevented.

The light emitting devices 100 may be attached to the carrier substrate with an adhesive layer interposed therebetween. The carrier substrate is not particularly limited as long as the carrier substrate stably mounts the light emitting device 100.

The light emitting device 100 attached on the carrier substrate may be mounted on the circuit board 11p. According to an exemplary embodiment, the circuit board 11p may include an upper circuit electrode 11pa, a lower circuit electrode 11pc, and an intermediate circuit electrode 11pb that are electrically connected to one another. The upper circuit electrodes 11pa may correspond to each of the first, second, third, and fourth connection electrodes 20ce, 30ce, 40ce, and 50ce, respectively. In some exemplary embodiments, the upper circuit electrodes 11pa may be surface-treated by ENIG, and partially melt at a high temperature, electrical connection to the connection electrodes to the light emitting device 100 may be facilitated.

According to the illustrated exemplary embodiment, the light emitting devices 100 may be spaced apart from one another on the carrier substrate at a desired pitch in consideration of a pitch (P, see FIG. 9B) of the upper circuit electrode 11pa of the circuit board 11p which will be mounted on a final target device such as a display apparatus.

According to an exemplary embodiment, the first, second, third, and fourth connection electrodes 20ce, 30ce, 40ce, and 50ce of the light emitting device 100 may be bonded to the upper circuit electrodes 11pa of the circuit board 11p, respectively, by anisotropic conductive film (ACF) bonding, for example. When the light emitting device 100 is bonded to the circuit board 11p through ACF bonding, which may be performed at a lower temperature than other bonding methods, the light emitting device 100 may be prevented from being exposed to a high temperature while bonding. However, the inventive concepts are not limited to a specific bonding method. For example, in some exemplary embodiments, the light emitting devices 100 may be bonded to the circuit board 11p using anisotropic conductive paste (ACP), solder, a ball grid array (BGA), or a micro bump including at least one of Cu and Sn. In this case, since the upper surfaces of the connection electrodes 20ce, 30ce, 40ce, and 50ce and the protection layer 90 are substantially flush with one another by a polishing process or the like, adhesion of the light emitting device 100 to the anisotropic conductive film increases, and thus, a more stable structure may be formed while bonding to the circuit board 11p.

Subsequently, a molding layer 91 is formed between the light emitting devices 100. According to an exemplary embodiment, the molding layer 91 may block light by reflecting or absorbing light emitted from the light emitting device 100. The molding layer 91 may be flush with the upper surface of the light emitting device 100, that is, the light emission surface, and accordingly, a viewing angle of light emitted from the first, second, and third light emitting stacks 20, 30, and 40 may be reduced. For example, the molding layer 91 may cover a side surface of the substrate 11 and be flush with an upper surface of the substrate 11. As such, the molding layer 91 may prevent light from being emitted to the side surface of the substrate 11 to reduce the viewing angle. Moreover, since the light emission surface is limited to the upper surface of the substrate 11, viewing angles of light emitted from the first, second, and third light emitting stacks 20, 30, and 40 may become substantially the same. In addition, the molding layer 91, along with the protection layer 90 formed on the light emitting device 100, may strengthen the structure of the light emitting device 100, and thus, additional protection to the light emitting package may be provided.

In an exemplary embodiment, the molding layer 91 may include an organic or inorganic polymer. In some exemplary embodiments, the molding layer 91 may further include fillers such as silica or alumina. In exemplary embodiments, the molding layer 91 may include the same material as the protection layer 90. The molding layer 91 may be formed through various methods well known in the art, such as lamination, plating and/or printing methods. For example, the molding layer 91 may be formed by a vacuum lamination process in which an organic polymer sheet is disposed on the light emitting device 100 and subjected to a high temperature and a high pressure in vacuum. In this manner, a substantially flat upper surface of the light emitting package may be provided, thereby improving uniformity of light. The molding layer 91 may be partially removed to expose the upper surface of the light emitting device 100 through a grinding process or an entire surface etching process.

In some exemplary embodiments, when the substrate 11 is removed from the light emitting device 100, the molding layer 91 may cover a side surface of the third lower contact electrode 45p and expose an upper surface of the third lower contact electrode 45p.

In the illustrated exemplary embodiment, although the upper surface of the molding layer 91 is illustrated and described as being flush with the upper surface of the light emitting device 100, in some exemplary embodiments, a portion of the molding layer 91 may cover the upper surface of the light emitting device 100. In this manner, it is possible to prevent light incident from the outside from being reflected by the light emitting device 100.

Meanwhile, the light emitting device 100 disposed on the circuit board 11p may be cut into a desired configuration and formed as a light emitting package 110. FIG. 9B shows four light emitting devices 100 (2×2) disposed on the circuit board 11p. However, the inventive concepts are not limited to a specific number of light emitting devices formed in the light emitting package 110. For example, in some exemplary embodiments, the light emitting package 110 may include one or more light emitting devices 100 formed on the circuit board 11p. In addition, the inventive concepts are not limited to a specific arrangement of one or more light emitting devices 100 in the light emitting package 110. For example, one or more light emitting devices 100 in the light emitting package 110 may be arranged in an n×m-arrangement, in which n and m refer to natural numbers. According to an exemplary embodiment, the circuit board 11p may include a scan line and a data line to independently drive each of the light emitting devices 100 included in the light emitting package 110.

Figure 10:
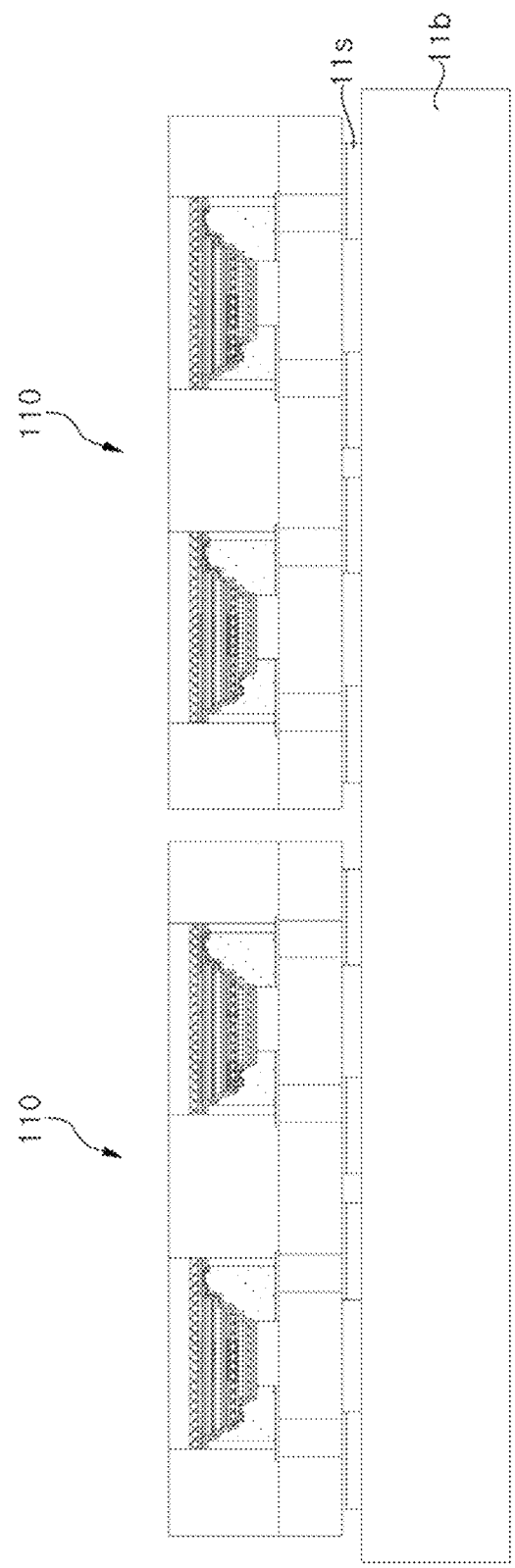
FIG. 10 is a schematic cross-sectional view illustrating a display apparatus according to an exemplary embodiment.

FIG. 10 is a schematic cross-sectional view illustrating a display apparatus according to an exemplary embodiment.

Referring to FIG. 10, the display apparatus may include a display substrate 11b and a light emitting package 110. The light emitting package 110 may be mounted on the display substrate 11b of a final apparatus, such as a display apparatus. The display substrate 11b may include target electrodes 11s that correspond to lower circuit electrodes 11pc of the light emitting package 110, respectively. The display apparatus according to an exemplary embodiment may include a plurality of pixels, and each of the light emitting devices 100 may be disposed to correspond to each pixel. More specifically, each light emitting stack of the light emitting devices 100 according to an exemplary embodiment may correspond to each sub-pixel of one pixel. Since the light emitting devices 100 include the light emitting stacks 20, 30, and 40 that are vertically stacked, the number of devices to be transferred for each sub-pixel may be substantially reduced than that of conventional light emitting devices. In addition, since sides of connection electrodes opposite to each other have different lengths from each other, the connection electrode may be stably formed in the light emitting stack structure to strengthen an internal structure thereof. In addition, since the light emitting devices 100 according to some exemplary embodiments include a protection layer 90 between the connection electrodes, the light emitting devices 100 may be protected from an external impact.

In the illustrated exemplary embodiment, although the light emitting package 110 is described as being mounted on the display substrate 11b, in some exemplary embodiments, the process of manufacturing the light emitting package 110 may be omitted, and the light emitting devices 100 may be directly mounted on the display substrate 11b and a molding layer 91 may be formed.

Figure 11:
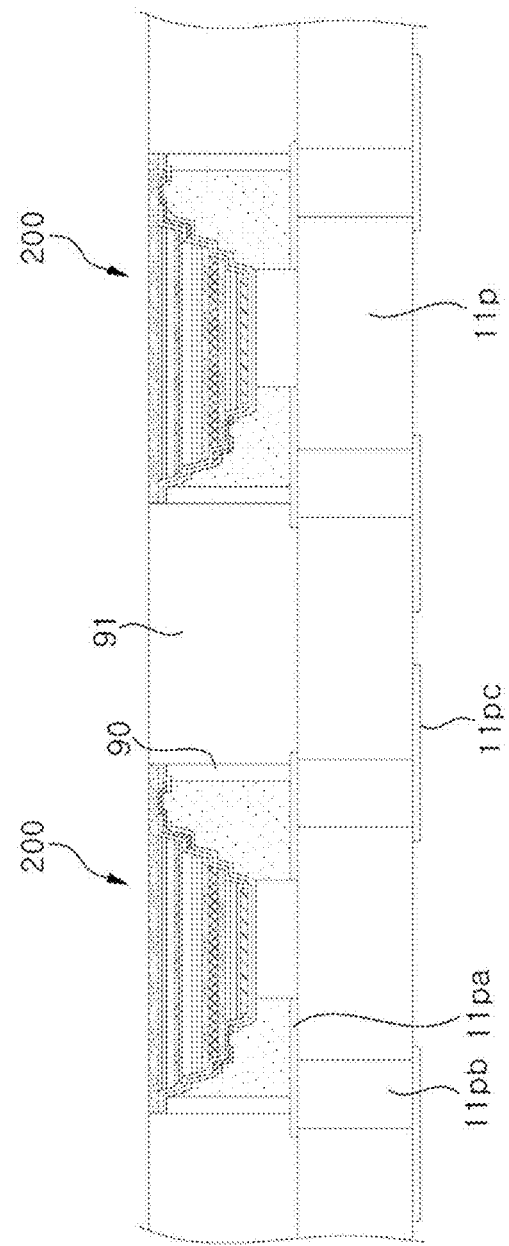
FIG. 11 is a schematic cross-sectional view illustrating a light emitting package according to another exemplary embodiment.

FIG. 11 is a schematic cross-sectional view illustrating a light emitting package according to another exemplary embodiment.

Referring to FIG. 11, the light emitting package according to the exemplary embodiment is substantially similar to that described with reference to FIGS. 9A and 9B, but a light emitting device 200 according to the illustrated exemplary embodiment does not include the substrate 11. More particularly, the substrate 11 and the third adhesive layer 65 are removed from the light emitting device 200, and thus, a third lower contact electrode 45p is exposed. The light emitting device 200 emits light through an upper surface of the third lower contact electrode 45p, and the upper surface of the third lower contact electrode 45p becomes a light emitting surface. In this case, a molding layer 91 may cover a side surface of the light emitting device 200 and expose the upper surface thereof FIG. 12 is a schematic cross-sectional view of a light emitting stack structure according to another exemplary embodiment.

Figure 12:
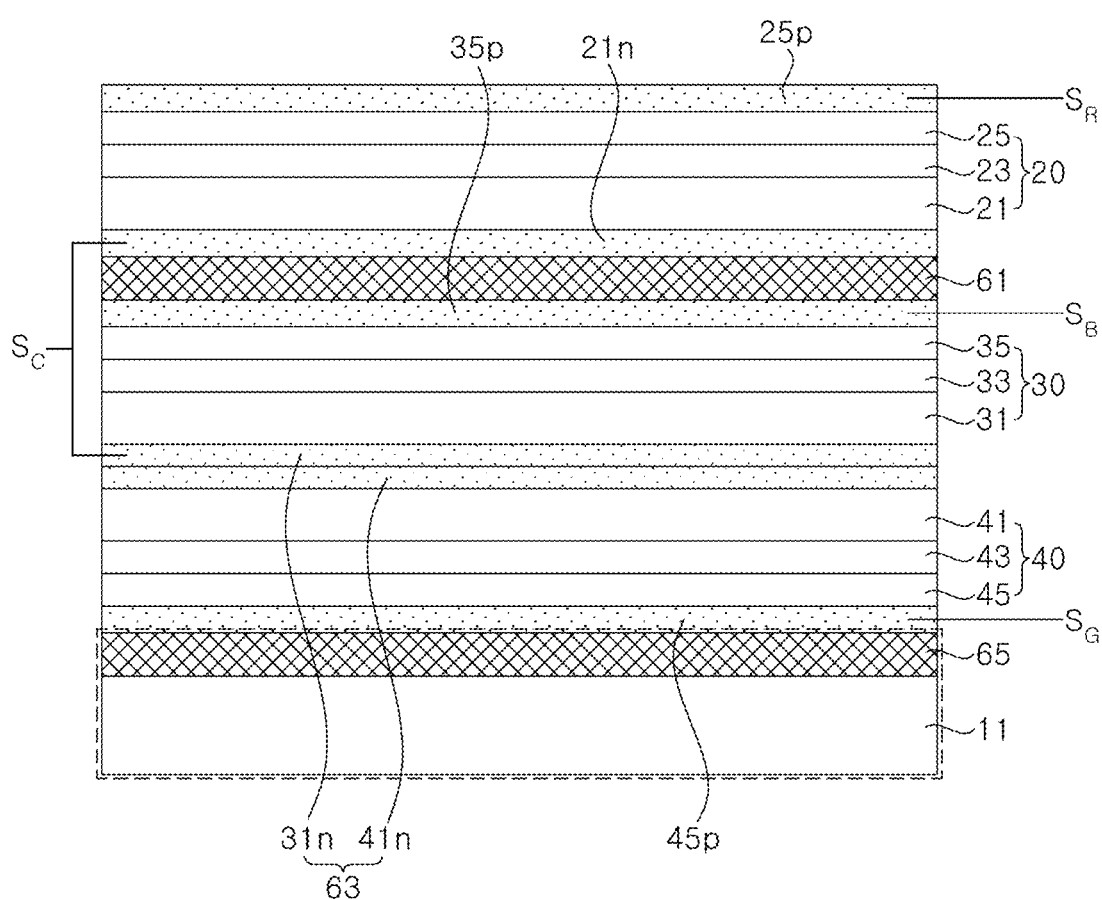
FIG. 12 is a schematic cross-sectional view of a light emitting stack structure according to another exemplary embodiment.

Referring to FIG. 12, the light emitting stack structure according to the illustrated exemplary embodiment is substantially similar to that of FIG. 2, but locations of a first conductivity type semiconductor layer 21 and a second conductivity type semiconductor layer 25 of the first light emitting stack 20 are different. More particularly, in the illustrated exemplary embodiment, the first conductivity type semiconductor layer 21 is disposed closer to the second light emitting stack 30 than the second conductivity type semiconductor layer 25. Meanwhile, a first upper contact electrode 21n is disposed under the first conductivity type semiconductor layer 21, and a first lower contact electrode 25p is disposed on the second conductivity type semiconductor layer 25.

Individual lines SR, SB, and SG may be electrically connected to first, second, and third lower contact electrodes 25p, 35p, and 45p, respectively, and a common line Sc may be electrically connected to the first upper contact electrode 21n and a second adhesive layer 63. A light emitting device having a common n-type light emitting stack structure may be provided by using the light emitting stack structure according to the illustrated exemplary embodiment.

Figure 13:
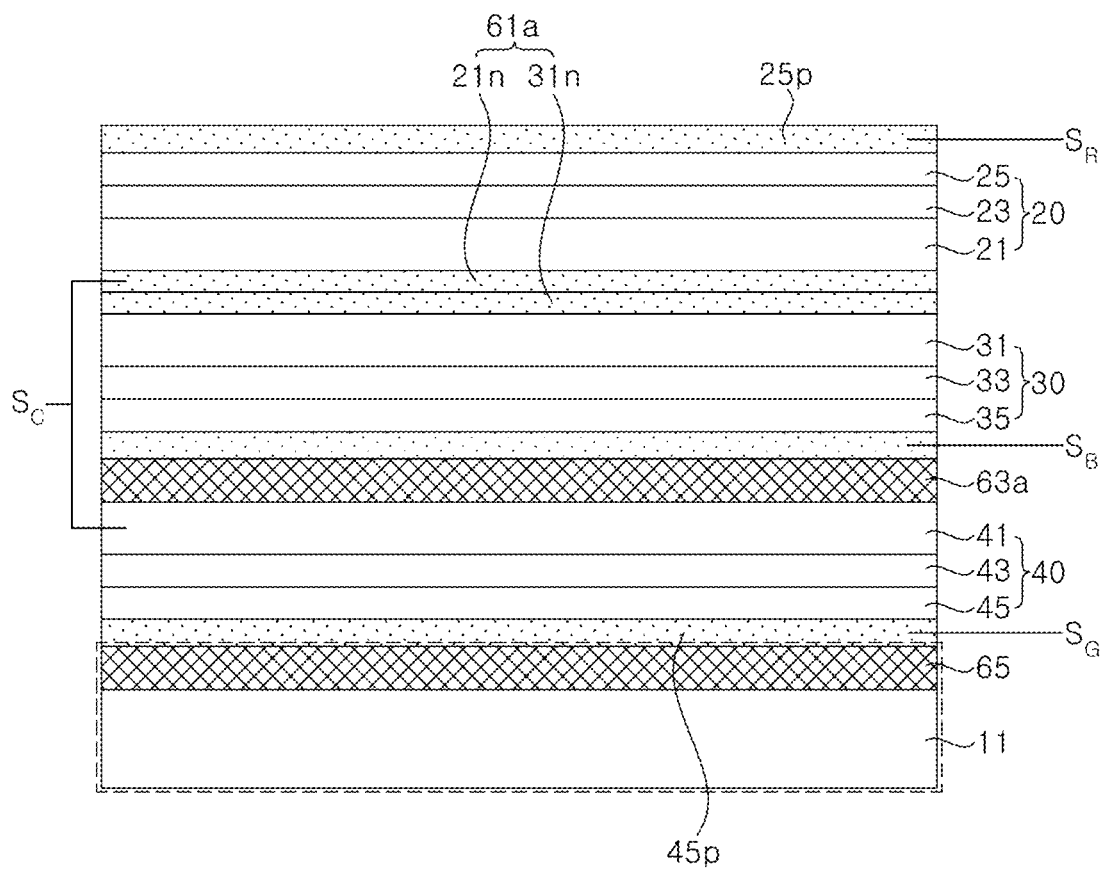
FIG. 13 is a schematic cross-sectional view of a light emitting stack structure according to another exemplary embodiment.

FIG. 13 is a schematic cross-sectional view of a light emitting stack structure according to another exemplary embodiment.

Referring to FIG. 13, the light emitting stack structure according to the illustrated exemplary embodiment is substantially similar to that of FIG. 2, but a first adhesive layer 61a includes a conductive material. More particularly, the second adhesive layer 63 shown in FIG. 2 includes the conductive material and electrically connects the first conductivity type semiconductor layers 31 and 41 to each other, but in this exemplary embodiment, the first adhesive layer 61a includes the conductive material and electrically connects first conductivity type semiconductor layers 21 and 31 to each other. The first adhesive layer 61a may be, for example, a bonding layer of a first upper contact electrode 21n and a second upper contact electrode 31n, in which each of the first upper contact electrode 21n and the second upper contact electrode 31n may be formed of a transparent conductive oxide layer, such as ITO. Meanwhile, a second adhesive layer 63a is formed of an insulating material, and thus, the third light emitting stack 40 is insulated from the second light emitting stack 30 by the second adhesive layer 63a.

Individual lines SR, SB, and SG may be electrically connected to first, second, and third lower contact electrodes 25p, 35p, and 45p, respectively, and a common line Sc may be electrically connected to the first adhesive layer 61a and a first conductivity type semiconductor layer 41. In this manner, a light emitting device having a common n-type light emitting stack structure may be provided by using the light emitting stack structure according to the illustrated exemplary embodiment.

Figure 14:
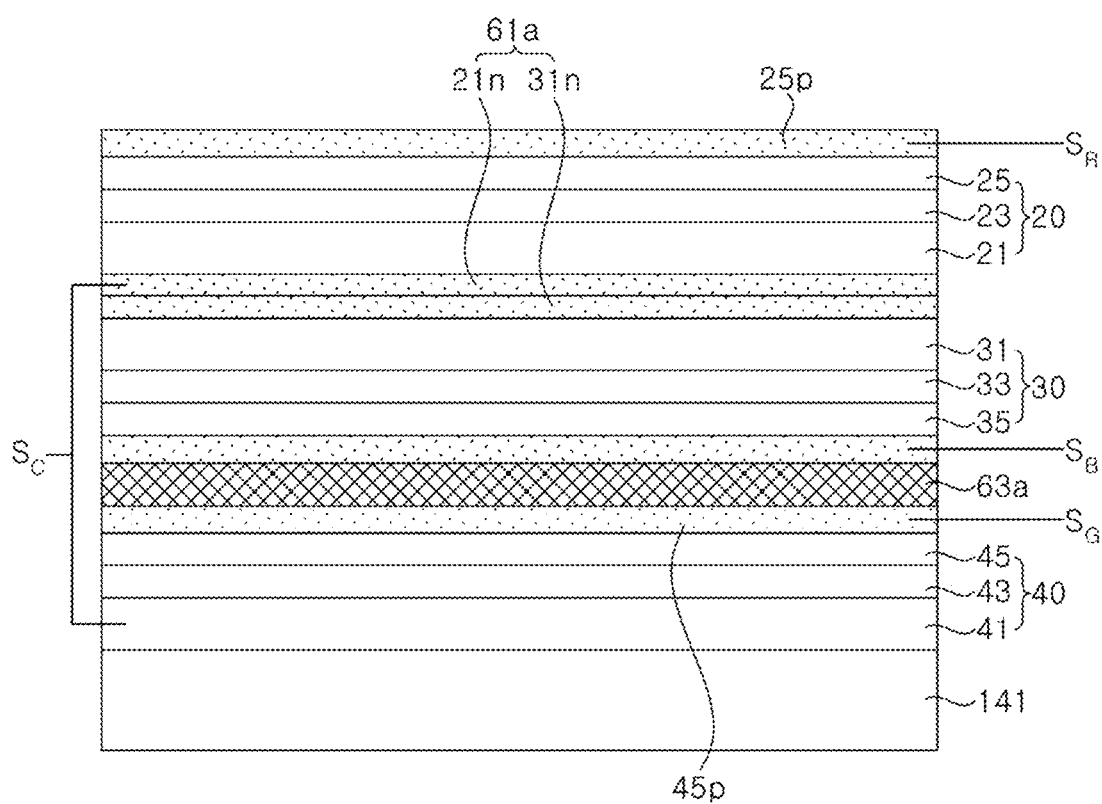
FIG. 14 is a schematic cross-sectional view of a light emitting stack structure according to another exemplary embodiment.

FIG. 14 is a schematic cross-sectional view of a light emitting stack structure according to another exemplary embodiment.

Referring to FIG. 14, the light emitting stack structure according to the illustrated exemplary embodiment is substantially similar to that of FIG. 13, but locations of a first conductivity type semiconductor layer 41 and a second conductivity type semiconductor layer 45 of the third light emitting stack 40 are different. More particularly, in the illustrated exemplary embodiment, the second conductivity type semiconductor layer 45 is disposed closer to the second light emitting stack 30 than the first conductivity type semiconductor layer 41. Meanwhile, a third lower contact electrode 45p is disposed on the second conductivity type semiconductor layer 45.

In the illustrated exemplary embodiment, a substrate 141 may be a growth substrate for growing the third light emitting stack 40, and the first conductivity type semiconductor layer 41 may be grown on the substrate 141. As such, the third adhesive layer 65 described in the previous exemplary embodiments may be obviated by retaining the substrate 141.

Individual lines SR, SB, and SG may be electrically connected to first, second, and third lower contact electrodes 25p, 35p, and 45p, respectively, and a common line Sc may be electrically connected to a first adhesive layer 61a and the first conductivity type semiconductor layer 41. In this manner, a light emitting device having a common n-type light emitting stack structure may be provided by using the light emitting stack structure according to the illustrated exemplary embodiment.

Figure 15:
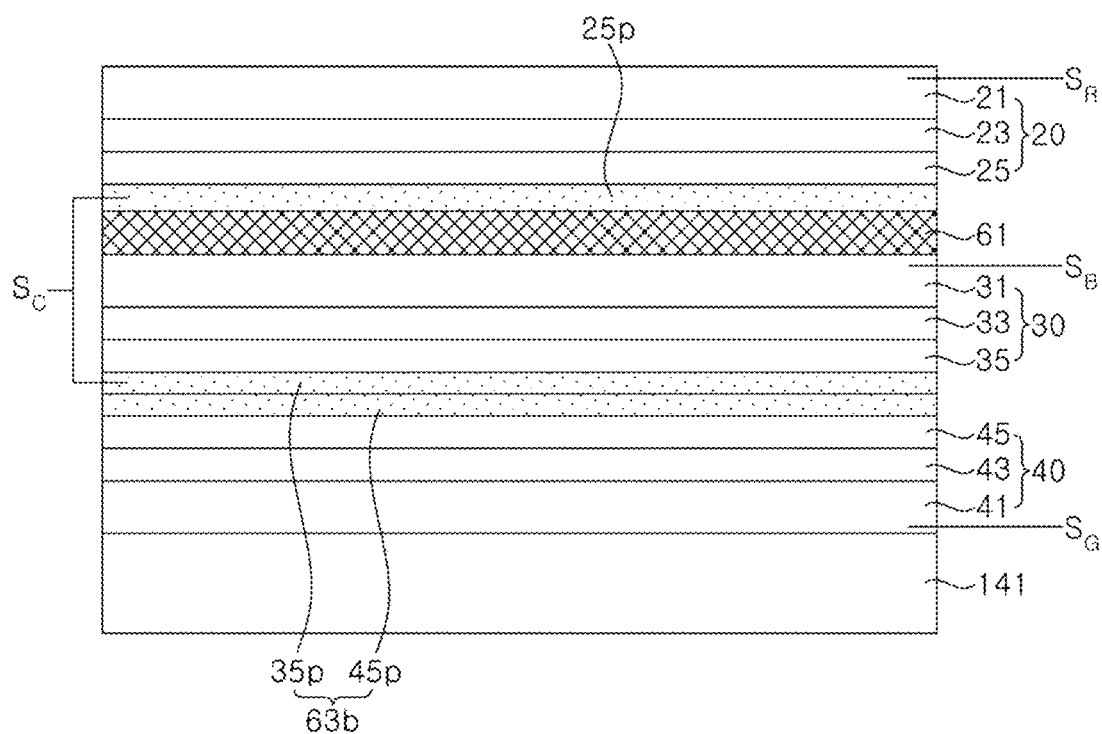
FIG. 15 is a schematic cross-sectional view of a light emitting stack structure according to another exemplary embodiment.

FIG. 15 is a schematic cross-sectional view of a light emitting stack structure according to another exemplary embodiment.

Referring to FIG. 15, the light emitting stack structure according to the illustrated exemplary embodiment is substantially similar to that of FIG. 2, but a second adhesive layer 63b electrically connects a second conductivity type semiconductor layer 35 of the second light emitting stack 30 and a second conductivity type semiconductor layer 45 of the third light emitting stack 40. In addition, a substrate 141 may be a growth substrate for growing the third light emitting stack 40.

In an exemplary embodiment, the second adhesive layer 63b may be a bonding layer of a second lower contact electrode 35p and a third lower contact electrode 45p, and each of the second and third lower contact electrodes 35p and 45p may be a transparent conductive oxide layer, such as ITO.

In the illustrated exemplary embodiment, individual lines SR, SB, and SG may be electrically connected to first conductivity type semiconductor layers 21, 31, and 41, respectively, and a common line Sc may be commonly electrically connected to a lower contact electrode 25p and the second adhesive layer 63b. In this manner, a light emitting device having a common p-type light emitting stack structure may be provided by using the light emitting stack structure according to the illustrated exemplary embodiment.

Figure 16:
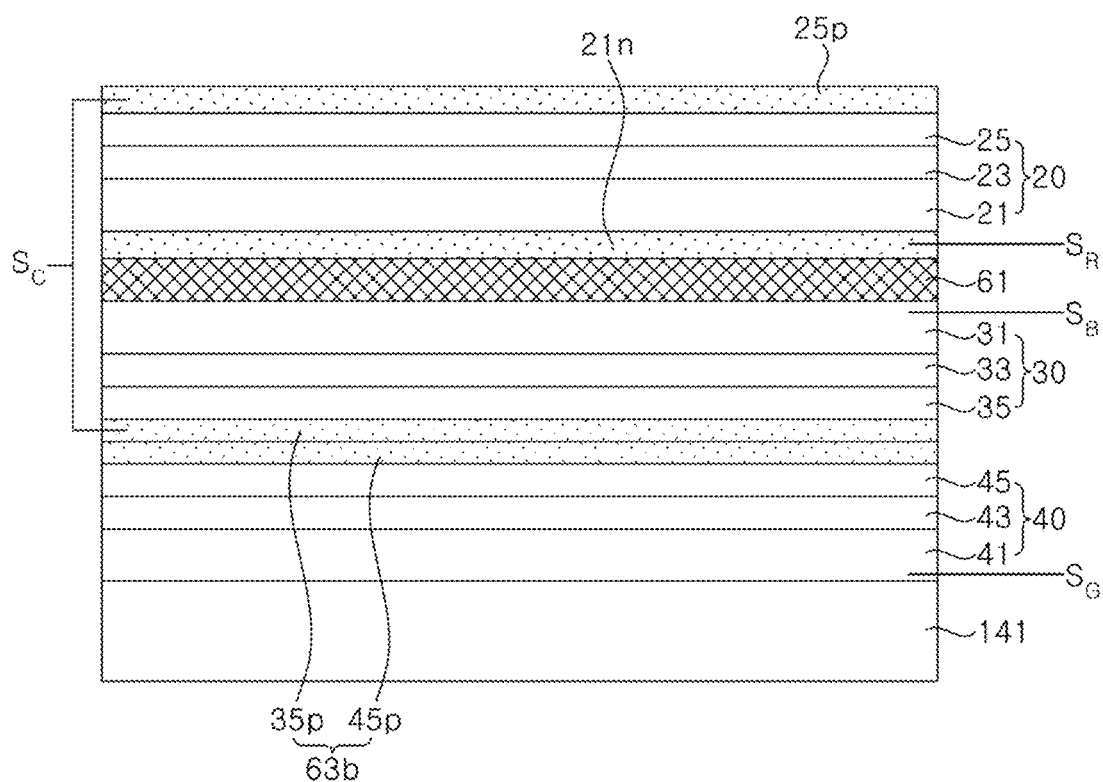
FIG. 16 is a schematic cross-sectional view of a light emitting stack structure according to another exemplary embodiment.

FIG. 16 is a schematic cross-sectional view of a light emitting stack structure according to another exemplary embodiment.

Referring to FIG. 16, the light emitting stack structure according to the illustrated exemplary embodiment is substantially similar to that of FIG. 15, but locations of a first conductivity type semiconductor layer 21 and a second conductivity type semiconductor layer 25 of the first light emitting stack 20 are different. More particularly, in the illustrated exemplary embodiment, the first conductivity type semiconductor layer 21 is disposed closer to the second light emitting stack 30 than the second conductivity type semiconductor layer 25. Meanwhile, a first upper contact electrode 21n is disposed under the first conductivity type semiconductor layer 21, and a first lower contact electrode 25p is disposed on the second conductivity type semiconductor layer 25.

Individual lines SR, SB, and SG may be electrically connected to the first conductivity type semiconductor layers 21, 31, and 41, respectively, and a common line Sc may be commonly electrically connected to the lower contact electrode 25p and a second adhesive layer 63b. In this manner, a light emitting device having a common p-type light emitting stack structure may be provided by using the light emitting stack structure according to the illustrated exemplary embodiment.

Figure 17:
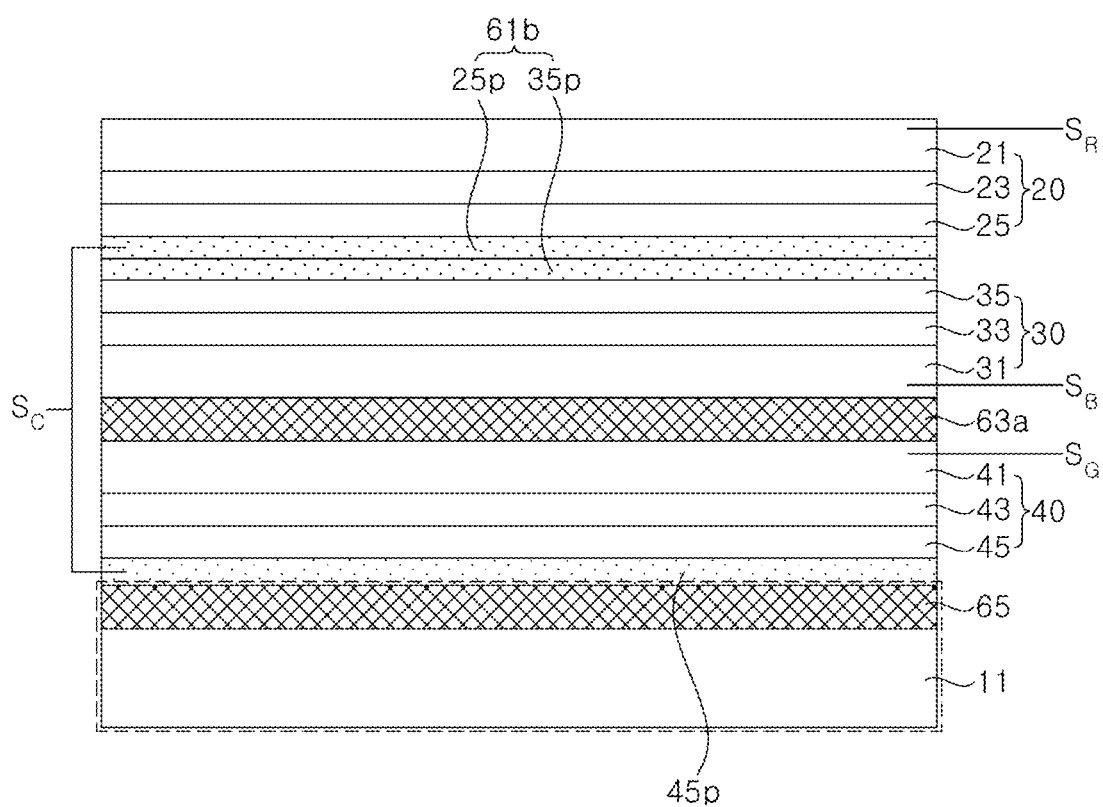
FIG. 17 is a schematic cross-sectional view of a light emitting stack structure according to another exemplary embodiment.

FIG. 17 is a schematic cross-sectional view of a light emitting stack structure according to another exemplary embodiment.

Referring to FIG. 17, the light emitting stack structure according to the illustrated exemplary embodiment is substantially similar to that of FIG. 13, but a first adhesive layer 61b electrically connects a second conductivity type semiconductor layer 25 of the first light emitting stack 20 and a second conductivity type semiconductor layer 35 of the second light emitting stack 30.

In an exemplary embodiment, the first adhesive layer 61b may be a bonding layer of a first lower contact electrode 25p and a second lower contact electrode 35p, and each of the first and second lower contact electrodes 25p and 35p may be a transparent conductive oxide layer, such as ITO.

In the illustrated exemplary embodiment, individual lines SR, SB, and SG may be electrically connected to first conductivity type semiconductor layers 21, 31, and 41, respectively, and a common line Sc may be commonly electrically connected to the first adhesive layer 61b and a third lower contact electrode 45p. In this manner, a light emitting device having a common p-type light emitting stack structure may be provided by using the light emitting stack structure according to the illustrated exemplary embodiment.

Figure 18:
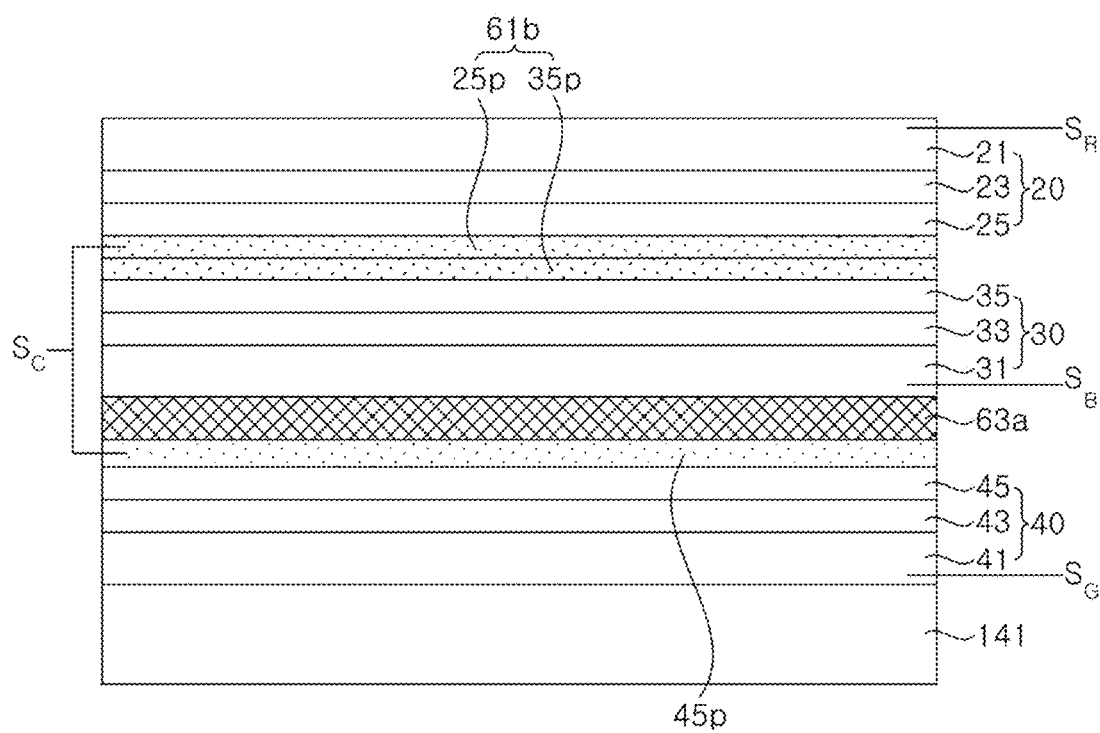
FIG. 18 is a schematic cross-sectional view of a light emitting stack structure according to another exemplary embodiment.

FIG. 18 is a schematic cross-sectional view of a light emitting stack structure according to another exemplary embodiment.

Referring to FIG. 18, the light emitting stack structure according to the illustrated exemplary embodiment is substantially similar to that of FIG. 17, but locations of a first conductivity type semiconductor layer 41 and a second conductivity type semiconductor layer 45 of the third light emitting stack 40 are different. More particularly, in the illustrated exemplary embodiment, the second conductivity type semiconductor layer 45 is disposed closer to the second light emitting stack 30 than the first conductivity type semiconductor layer 41. Meanwhile, a third lower contact electrode 45p is disposed on the second conductivity type semiconductor layer 45.

In the illustrated exemplary embodiment, a substrate 141 may be a growth substrate for growing the third light emitting stack 40, and the first conductivity type semiconductor layer 41 may be grown on the substrate 141. As such, the third adhesive layer 65 described in the previous exemplary embodiments is obviated by retaining the substrate 141.

Individual lines SR, SB, and SG may be electrically connected to first conductivity type semiconductor layers 21, 31, and 41, respectively, and a common line Sc may be commonly electrically connected to a first adhesive layer 61b and a lower contact electrode 45p. In this manner, a light emitting device having a common p-type light emitting stack structure may be provided by using the light emitting stack structure according to the illustrated exemplary embodiment.

Figure 19:
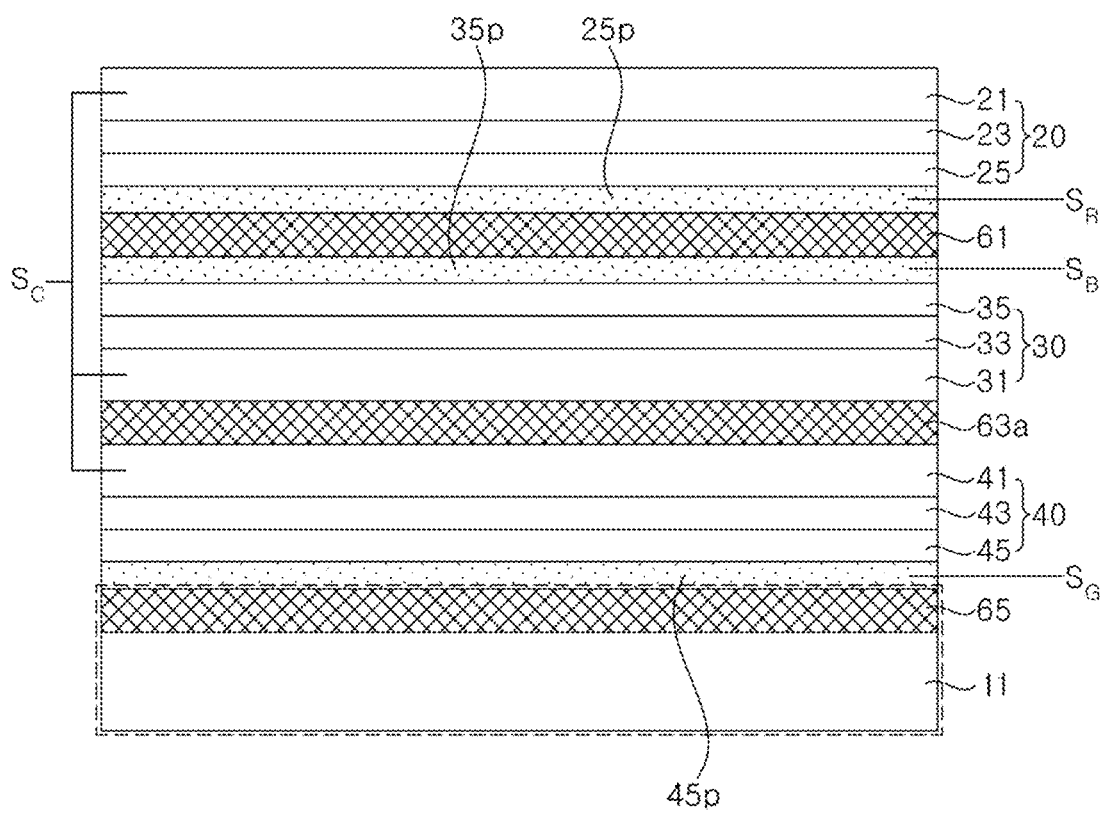
FIG. 19 is a schematic cross-sectional view of a light emitting stack structure according to another exemplary embodiment.

FIG. 19 is a schematic cross-sectional view of a light emitting stack structure according to another exemplary embodiment.

Referring to FIG. 19, the light emitting stack structure according to the illustrated exemplary embodiment is substantially similar to that of FIG. 2, but a second adhesive layer 63a includes a non-conductive material. The second adhesive layer 63a may transmit light. For example, second adhesive layer 63a may include an optically clear adhesive (OCA), which is epoxy, polyimide, SU8, spin-on-glass (SOG), benzocyclobutene (BCB), but the inventive concepts are not limited thereto.

As the second adhesive layer 63a includes the non-conductive material, a first conductivity type semiconductor layer 31 of the second light emitting stack 30 and a first conductivity type semiconductor layer 41 of the third light emitting stack 40 is insulated by the second adhesive layer 63a.

Figure 20A:
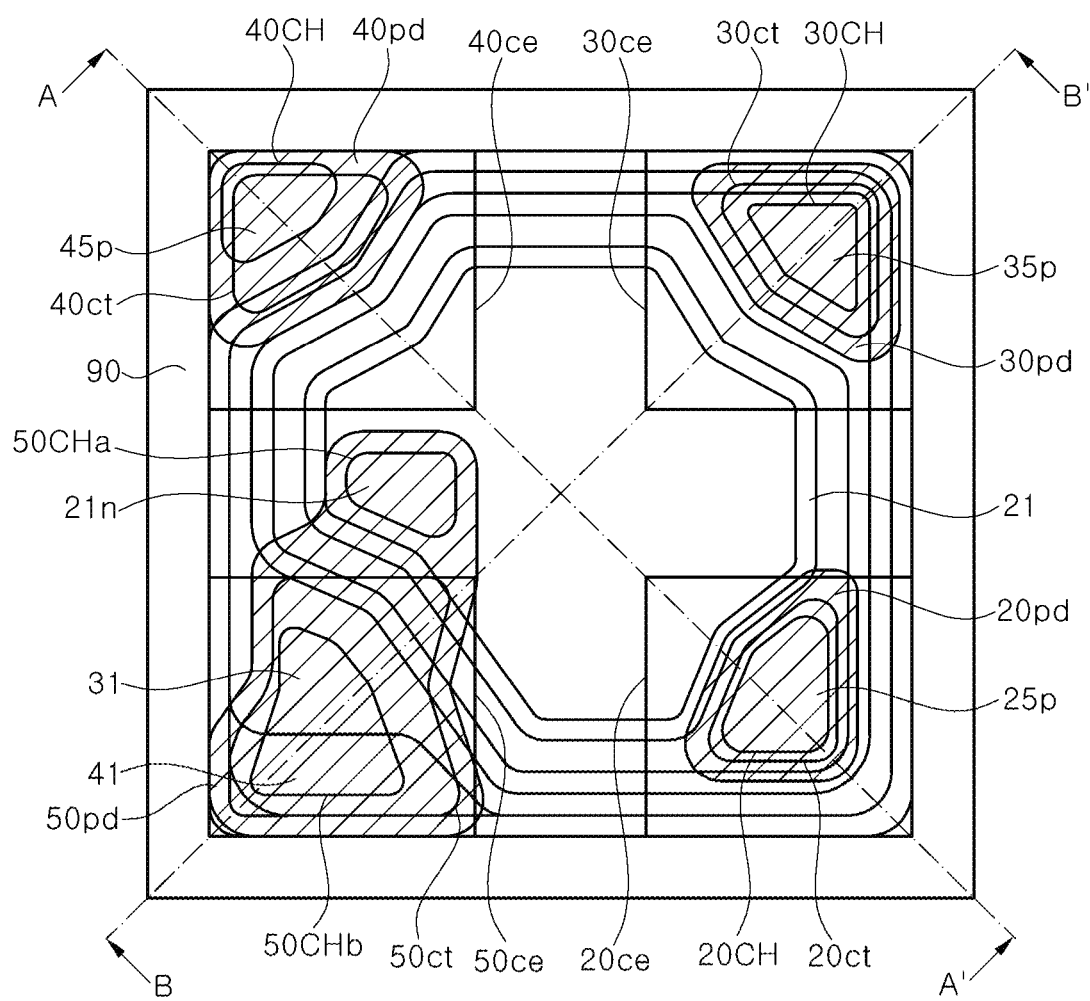
FIG. 20A is a schematic plan view illustrating a light emitting device according to another exemplary embodiment.
Figure 20B:
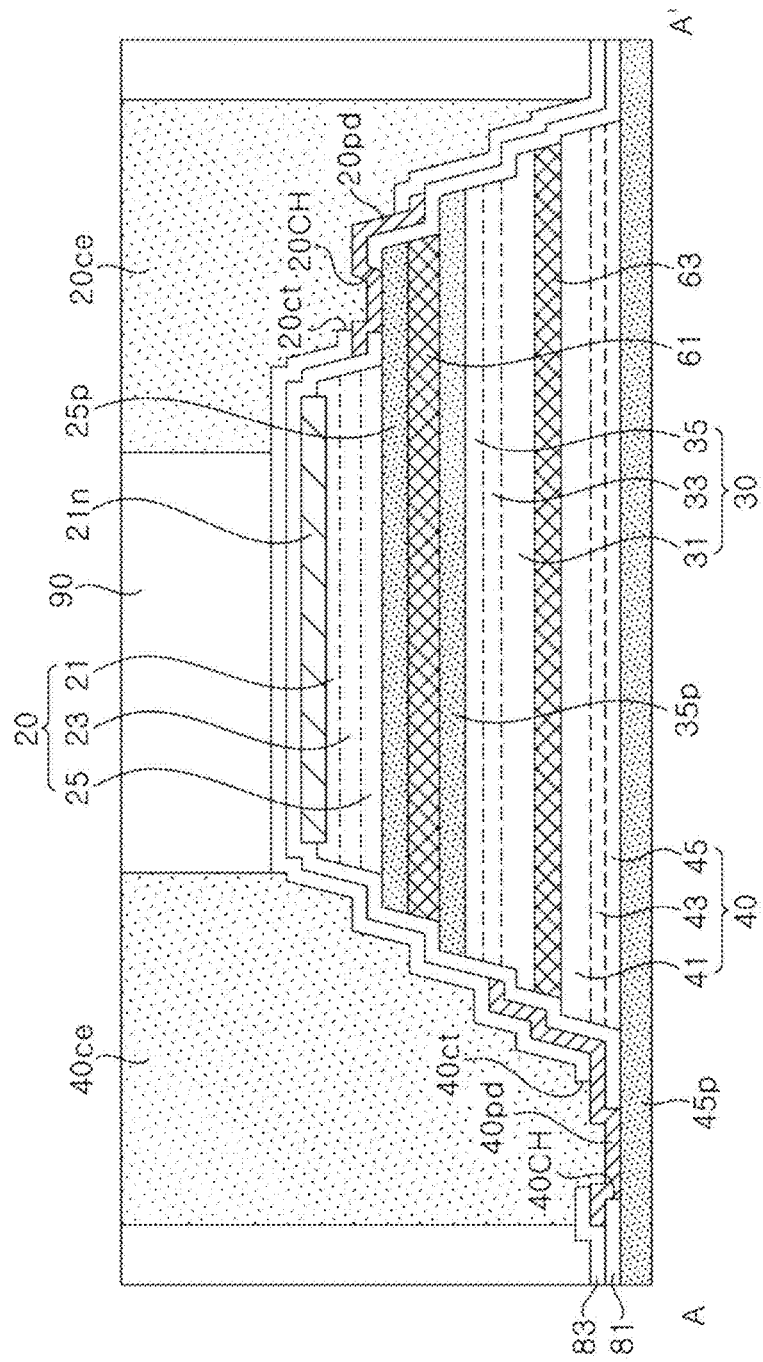
FIG. 20B is a schematic cross-sectional view taken along line A-A' of FIG. 20A.
Figure 20C:
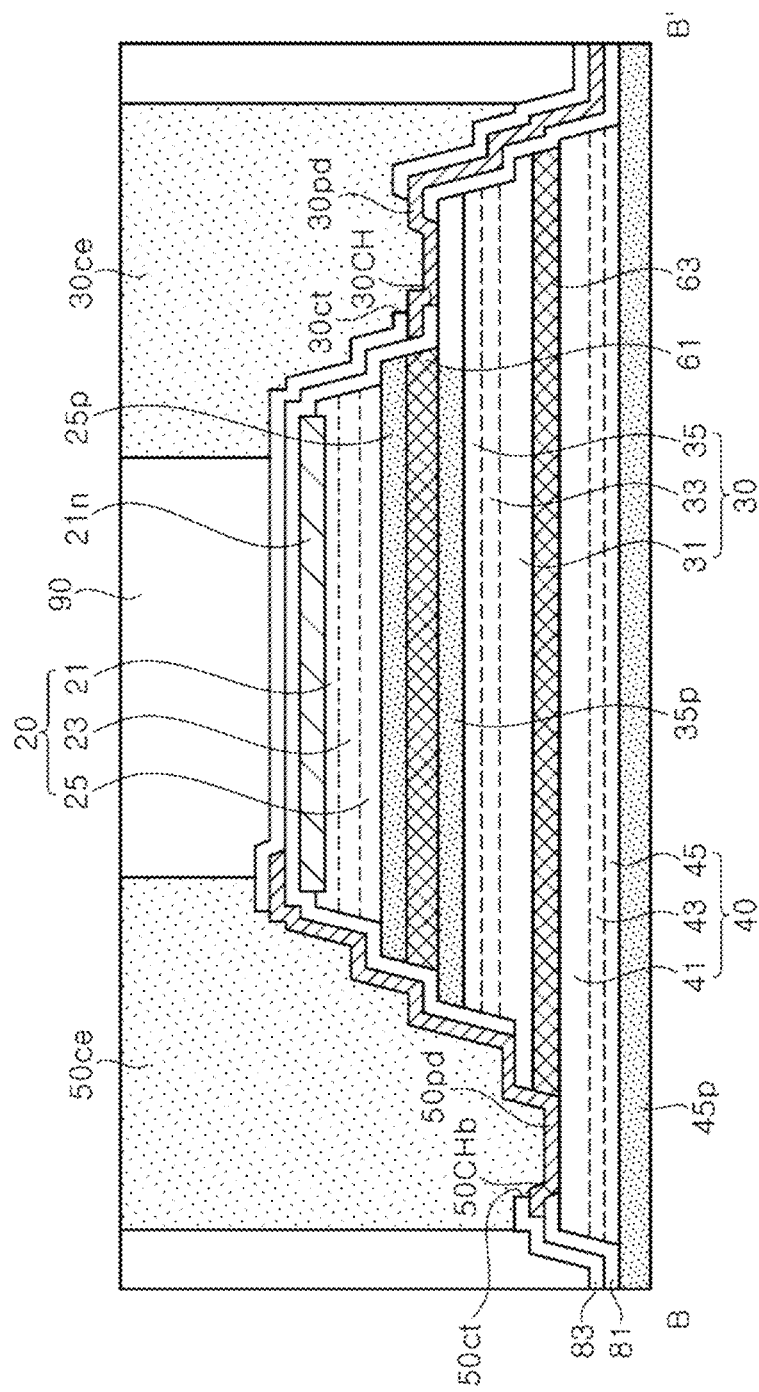
FIG. 20C is a schematic cross-sectional view taken along line B-B' of FIG. 20A.

FIG. 20A is a schematic plan view illustrating a light emitting device according to another exemplary embodiment, FIG. 20B is a schematic cross-sectional view taken along line A-A' of FIG. 20A, and FIG. 20C is a schematic cross-sectional view taken along line B-B' of FIG. 20A. The light emitting device according to the illustrated exemplary embodiment may include the light emitting stack structure of FIG. 19, and a manufacturing process thereof will be omitted.

Referring to FIGS. 20A, 20B, and 20C, the light emitting device according to the illustrated exemplary embodiment is substantially similar to the light emitting device 100 described above with reference to FIGS. 1A to 1D, but a second adhesive layer 63a includes a non-conductive material.

For example, a second sub-contact hole 50CHb of a first insulation layer 81 does not expose a portion of the second adhesive layer 63a, but exposes a portion of a first conductivity type semiconductor layer 31 and a portion of a first conductivity type semiconductor layer 41 together. As the first conductivity type semiconductor layers 31 and 41 may be simultaneously exposed using a single sub-contact hole 50CHb, a process margin may be increased.

Meanwhile, a fourth pad 50pd may be electrically connected to the first conductivity type semiconductor layers 31 and 41 through the second sub-contact hole 50CHb, and may be electrically connected to a first upper contact electrode 21n through a first sub-contact hole 50CHa. A fourth connection electrode 50ce is connected to the fourth pad 50pd exposed through a through hole 50ct of a second insulation layer 83, and thus, the fourth connection electrode 50ce may be commonly electrically connected to the first conductivity type semiconductor layers 21, 31, and 41 through the fourth pad 50pd. As such, a light emitting device having a common n-structure may be provided.

In the illustrated exemplary embodiment, the substrate 11 and the third adhesive layer 65 of FIG. 19 may be finally removed from the light emitting device. In another exemplary embodiment, the substrate 11 and the third adhesive layer 65 may be retained on the light emitting device.

According to exemplary embodiments, since the first, second, and third light emitting stacks are overlapped with one another, an area of each sub-pixel may be increased within a limited pixel area without increasing the pixel area. Furthermore, since the light emitting device includes the first, second, and third light emitting stacks, a total number of light emitting devices may be reduced compared to that of a conventional light emitting device, and thus, a mounting process time of the light emitting device may be reduced. Moreover, since one of the first adhesive layer and the second adhesive layer electrically connects adjacent light emitting stacks, a manufacturing process of the light emitting device may be simplified.

According to an exemplary embodiment, the first, second, and third light emitting stacks may emit red light, green light, and blue light, respectively. In another exemplary embodiment, the first, second, and third light emitting stacks may emit red light, blue light, and green light, respectively. By adjusting the second light emitting stack to emit blue light and the third light emitting stack to emit green light, luminous intensity of blue light may be reduced and luminous intensity of green light may be increased to control an RGB color mixing ratio.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display light emitting apparatus, comprising:
a circuit board;
a set of light emitters that includes a first light emitter, a second light emitter, and a third light emitter disposed on the circuit board, each light emitter including a first conductivity type semiconductor layer and a second conductivity type semiconductor layer;
an adhesive layer including a first adhesive region disposed between the first light emitter and the second light emitter and a second adhesive region disposed between the second light emitter and the third light emitter; and
a mold surrounding the set of light emitters;
wherein:
the mold is laterally spaced apart from the set of light emitters;
each of the light emitters includes an irregularity region that is formed on a surface that corresponds to the light emitter;
the second light emitter is disposed between the first light emitter and the third light emitter; and
the first adhesive region and the second adhesive region are optically transmitting and connect adjacent light emitters.

2. The light emitting apparatus of claim 1, wherein the first, second, and third light emitters are configured to emit red light, blue light, and green light, respectively.

3. The light emitting apparatus of claim 1, further comprising at least one electrode disposed on the circuit board, wherein the at least one electrode is commonly electrically connected to the first, second, and third light emitters.

4. The light emitting apparatus of claim 1, wherein a sequence of the first conductivity type semiconductor layer and the second conductivity type semiconductor layer of the first light emitter is different from a sequence of the first conductivity type semiconductor layer and the second conductivity type semiconductor layer of the second light emitter, and wherein the second adhesive region includes layers of two different light emitters that have a same conductivity type.

5. The light emitting apparatus of claim 1, wherein the first light emitter includes a contact electrode comprising a germanium material.

6. The light emitting apparatus of claim 1, wherein the first, second, and third light emitters are configured to be operated independently.

7. A light emitting apparatus, comprising:
a circuit board;
a set of light emitters that includes a first light emitter, a second light emitter, and a third light emitter disposed on the circuit board, each light emitter including a first conductivity type semiconductor layer and a second conductivity type semiconductor layer;
an adhesive layer including a first adhesive region disposed between the first light emitter and the second light emitter and a second adhesive region disposed between the second light emitter and the third light emitter; and
a mold surrounding the set of light emitters;
wherein:
the mold is laterally spaced apart from the set of light emitters;
the first light emitter includes an irregularity region formed on a surface of the first light emitter;
the second light emitter is disposed between the first light emitter and the third light emitter; and
the first adhesive region and the second adhesive region are optically transmitting and connect adjacent light emitters.

8. The light emitting apparatus of claim 7, wherein the first light emitter includes at least one of: AlGaAs, AlGaInP, and GaP.

9. The light emitting apparatus of claim 7, wherein a sequence of the first conductivity type semiconductor layer and the second conductivity type semiconductor layer of the first light emitter is different from a sequence of the first conductivity type semiconductor layer and the second conductivity type semiconductor layer of the second light emitter, and wherein the second adhesive region includes layers of two different light emitters that have a same conductivity type.

10. The light emitting apparatus of claim 7, wherein the first light emitter includes a contact electrode comprising a germanium material.

11. The light emitting apparatus of claim 7, wherein the first, second, and third light emitters are configured to be operated independently.

12. The light emitting apparatus of claim 7, further comprising at least one electrode disposed on the circuit board, wherein the at least one electrode is commonly electrically connected to the first, second, and third light emitters.

13. A light emitting apparatus, comprising:
a circuit board;
a set of light emitters that includes a first light emitter, a second light emitter, and a third light emitter disposed on the circuit board, each light emitter including a first conductivity type semiconductor layer and a second conductivity type semiconductor layer;
an adhesive layer including a first adhesive region disposed between the first light emitter and the second light emitter and a second adhesive region disposed between the second light emitter and the third light emitter; and
a molding layer surrounding the first, second, and third light emitters;
wherein:
the molding layer is laterally spaced apart from the set of light emitters;
the second and third light emitters have an irregularity region that is formed on surfaces that correspond to the second and third light emitters;
the second light emitter is disposed between the first light emitter and the third light emitter; and
the first adhesive portion and the second adhesive region are optically transmitting and connect adjacent light emitters.

14. The light emitting apparatus of claim 13, wherein the first light emitter includes at least one of: AlGaAs, AlGaInP, and GaP.

15. The light emitting apparatus of claim 13, wherein a sequence of the first conductivity type semiconductor layer and the second conductivity type semiconductor layer of the first light emitter is different from a sequence of the first conductivity type semiconductor layer and the second conductivity type semiconductor layer of the second light emitter, and wherein the second adhesive region includes layers of two different light emitters that have a same conductivity type.

16. The light emitting apparatus of claim 13, wherein the first light emitter includes a contact electrode comprising a germanium material.

17. The light emitting apparatus of claim 13, wherein the first, second, and third light emitters are configured to be operated independently.

18. The light emitting apparatus of claim 13, further comprising at least one electrode disposed on the circuit board, wherein the at least one electrode is commonly electrically connected to the first, second, and third light emitters.

* * * * *